US011343927B2

(12) United States Patent
Choi

(10) Patent No.: US 11,343,927 B2
(45) Date of Patent: May 24, 2022

(54) DISPLAY MODULE AND ELECTRONIC DEVICE INCLUDING THE SAME

(71) Applicant: Samsung Electronics Co., Ltd., Suwon-si (KR)

(72) Inventor: Jonghwan Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 69 days.

(21) Appl. No.: 17/025,020

(22) Filed: Sep. 18, 2020

(65) Prior Publication Data

US 2021/0092855 A1    Mar. 25, 2021

(30) Foreign Application Priority Data

Sep. 20, 2019    (KR) .................. 10-2019-0116400
Jul. 31, 2020    (KR) .................. 10-2020-0096411

(51) Int. Cl.
*H05K 7/02*    (2006.01)
*H05K 7/04*    (2006.01)
*H05K 5/02*    (2006.01)
*H05K 5/00*    (2006.01)
*H05K 5/03*    (2006.01)

(52) U.S. Cl.
CPC ......... *H05K 5/0217* (2013.01); *H05K 5/0017* (2013.01); *H05K 5/0086* (2013.01); *H05K 5/03* (2013.01)

(58) Field of Classification Search
USPC ....................................................... 361/807
See application file for complete search history.

(56) References Cited

U.S. PATENT DOCUMENTS

| 9,348,369 | B2 | 5/2016 | Kee et al. |
| 9,939,847 | B2 | 4/2018 | Kee et al. |
| 10,368,452 | B2 | 7/2019 | Yun et al. |
| 10,444,797 | B2 | 10/2019 | Kee et al. |
| 10,725,498 | B2 | 7/2020 | Han et al. |
| 10,930,883 | B2 * | 2/2021 | Park .................. G06F 1/1652 |

(Continued)

FOREIGN PATENT DOCUMENTS

| CN | 106816530 A | 6/2017 |
| KR | 10-2019-0003257 A | 1/2019 |
| KR | 10-2019-0081341 A | 7/2019 |

OTHER PUBLICATIONS

International Search Report dated Jan. 5, 2021, issued in International Application PCT/KR2020/012609.

*Primary Examiner* — Hung S. Bui
(74) *Attorney, Agent, or Firm* — Jefferson IP Law, LLP

(57) ABSTRACT

A display module and an electronic device including the same are provided. The display module includes a display panel including a first edge and a second edge facing the first edge, a support plate on a rear surface of the display panel, and an adhesive layer between the display panel and the support plate. The adhesive layer includes first and second areas providing a first adhesive force and a third area providing a second adhesive force different from the first adhesive force and disposed between the first area and the second area, the third area extending from the first edge to the second edge. The third area has a first width in a central area between the first edge and the second edge and a second width in areas adjacent to the first edge and the second edge, the second width being different from the first width.

20 Claims, 26 Drawing Sheets

(56) References Cited

U.S. PATENT DOCUMENTS

| | | |
|---|---|---|
| 2014/0355195 A1 | 12/2014 | Kee et al. |
| 2015/0266272 A1* | 9/2015 | Lee ........................ B32B 17/10 |
| | | 428/189 |
| 2016/0266612 A1 | 9/2016 | Kee et al. |
| 2018/0192527 A1 | 7/2018 | Yun et al. |
| 2018/0203487 A1 | 7/2018 | Kee et al. |
| 2019/0067386 A1 | 2/2019 | Chun et al. |
| 2019/0107866 A1 | 4/2019 | Han et al. |
| 2019/0204867 A1 | 7/2019 | Song et al. |
| 2019/0391615 A1 | 12/2019 | Kee et al. |
| 2020/0183457 A1* | 6/2020 | Youn ..................... G06F 1/1652 |
| 2021/0118337 A1* | 4/2021 | Park ........................ G09F 9/301 |

* cited by examiner

DISPLAY MODULE AND ELECTRONIC DEVICE INCLUDING THE SAME

CROSS-REFERENCE TO RELATED APPLICATION(S)

This application is based on and claims priority under 35 U.S.C. § 119(a) of a Korean patent application number 10-2019-0116400, filed on Sep. 20, 2019, and of a Korean patent application number 10-2020-0096411, filed on Jul. 31, 2020 in the Korean Intellectual Property Office, the disclosure of each of which is incorporated by reference herein its entirety.

BACKGROUND

1. Field

The disclosure relates to a display module and an electronic device including the same.

2. Description of Related Art

In recent years, with the development of display technology, a foldable electronic device including a flexible display has been developed. The flexible display may include a flat area and a bending area that is deformed into a flat surface or a curved surface. The bending area may be formed to be a curved surface in a folded state and may be formed to be a flat surface in a flat state. Accordingly, the foldable electronic device may provide portability in the folded state and may provide a large screen in the flat state.

The above information is presented as background information only to assist with an understanding of the disclosure. No determination has been made, and no assertion is made, as to whether any of the above might be applicable as prior art with regard to the disclosure.

SUMMARY

In the folded state, a folding area of the flexible display of the foldable electronic device may be deformed in the direction of a folding axis. Due to this, the curvature of the folding area may not be uniform.

Aspects of the disclosure are to address at least the above-mentioned problems and/or disadvantages and to provide at least the advantages described below. Accordingly, an aspect of the disclosure is to provide a display module having a uniform curvature by correcting a length change in the direction of a folding axis in a folded state, and an electronic device including the display module.

Additional aspects will be set forth in part in the description which follows and, in part, will be apparent from the description, or may be learned by practice of the presented embodiments.

In accordance with an aspect of the disclosure, a display module includes a display panel including a first edge and a second edge facing the first edge, a support plate disposed on a rear surface of the display panel, and an adhesive layer disposed between the display panel and the support plate. The adhesive layer includes a first area and a second area that provide a first adhesive force and a third area that provides a second adhesive force different from the first adhesive force and that is disposed between the first area and the second area, the third area extending from the first edge to the second edge. The third area has a first width in a central area between the first edge and the second edge and has a second width in areas adjacent to the first edge and the second edge, the second width being different from the first width.

In accordance with another aspect of the disclosure, an electronic device includes a housing structure including a first housing and a second housing, and a display module disposed in the first housing and the second housing, in which the first housing and the second housing are unfolded or folded about a folding axis. The display module includes a cover layer that forms a surface of the electronic device, a panel layer including a pixel array, an enhanced cover glass layer disposed between the cover layer and the panel layer, a support plate disposed on a rear surface of the panel layer, and a first adhesive layer and a second adhesive layer that bond the panel layer and the support plate. The panel layer includes a first flat area, a second flat area, and a folding area formed to be a curved surface or a flat surface when the first housing and the second housing are unfolded or folded. The support plate includes a first support area attached to at least part of the first flat area by the first adhesive layer, a second support area attached to at least part of the second flat area by the second adhesive layer, and a slit area that is formed between the first support area and the second support area and that includes a plurality of slits. When viewed from above the rear surface of the panel layer, the first adhesive layer and the second adhesive layer are spaced apart from each other by a first width at a central portion in a direction of the folding axis and are spaced apart from each other by a second width at edges in the direction of the folding axis, the second width being greater than the first width.

In accordance with another aspect of the disclosure, an electronic device includes a housing structure that includes a first housing and a second housing and that is configured such that the first housing and the second housing are folded about a virtual folding axis to face each other, and a display module disposed in the first housing and the second housing, the display module including a panel layer, an adhesive layer, and a plate, in which the adhesive layer includes a first area, a second area, and a third area formed between the first area and the second area and is formed on a rear surface of the panel layer, and the plate includes at least a portion disposed on the first area and the second area and at least a portion extending to the third area. The display module includes a first edge extending in a direction perpendicular to the folding axis, a second edge facing the first edge, a third edge extending in a direction of the folding axis and adjacent to the first area, and a fourth edge facing the third edge and adjacent to the second area. The first area forms a first boundary with the third area, and the second area forms a second boundary with the third area. The first boundary and the second boundary extend from the first edge to the second edge such that the first boundary and the second boundary have a first interval at a central portion between the first edge and the second edge and have a second interval at a portion adjacent to the first edge and/or the second edge, the second interval being different from the first interval.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components and structures.

DETAILED DESCRIPTION

The following description with reference to accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modification of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
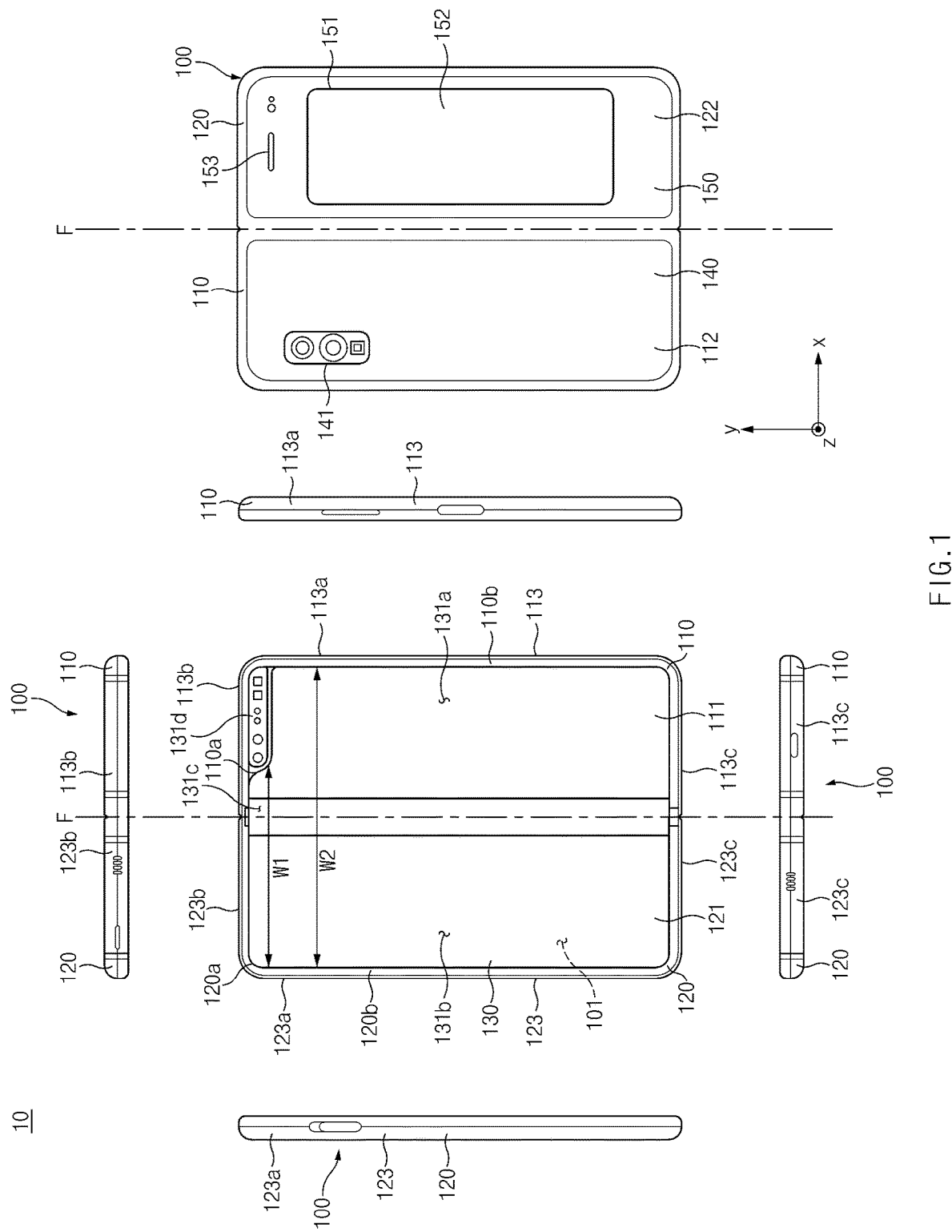
FIG. 1 is a view illustrating a flat state of an electronic device according to an embodiment of the disclosure.
Figure 2:
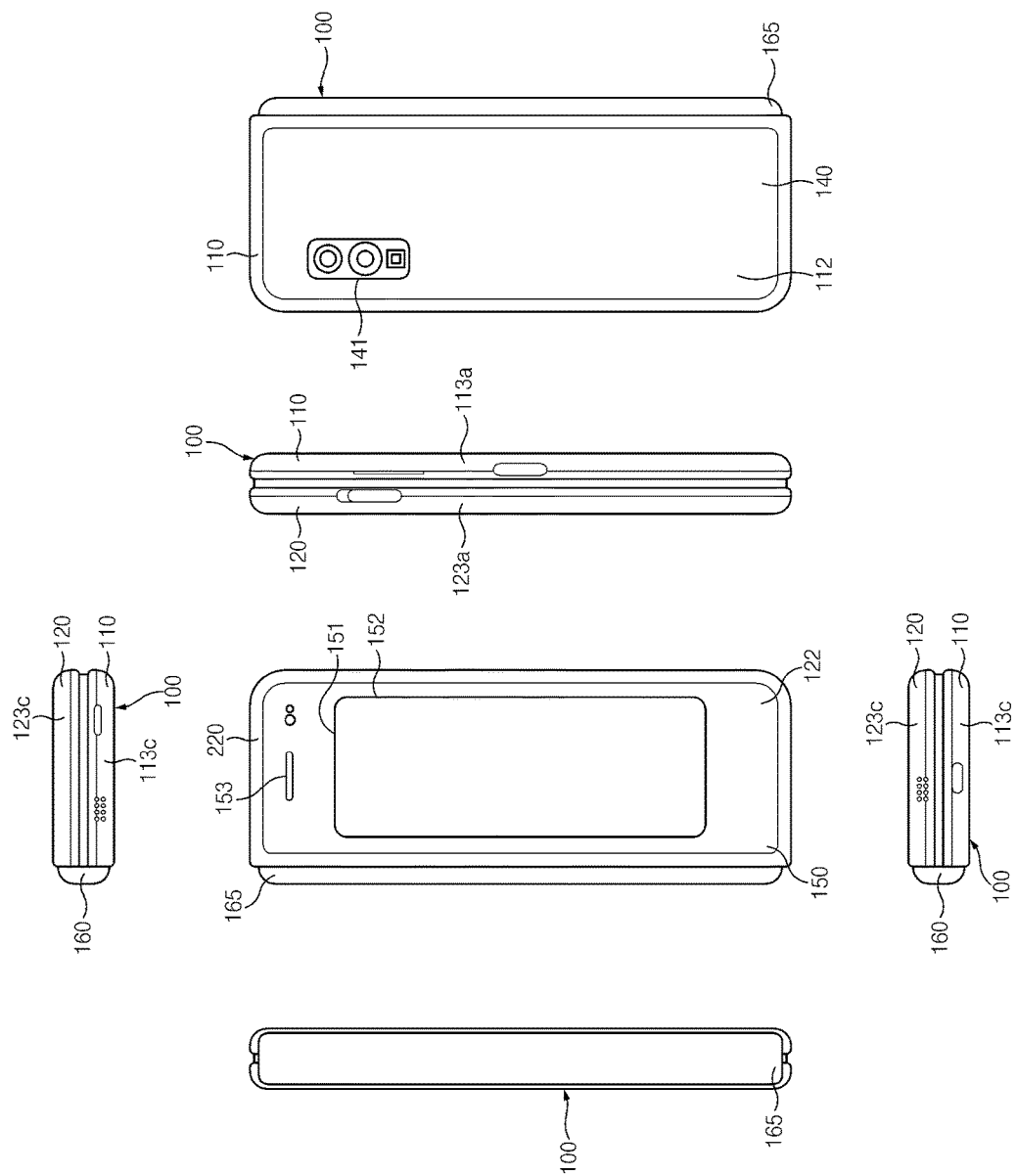
FIG. 2 is a view illustrating a folded state of the electronic device of FIG. 1 according to an embodiment of the disclosure.

FIG. 1 is a view illustrating a flat state of an electronic device 100 according to an embodiment of the disclosure. FIG. 2 is a view illustrating a folded state of the electronic device 100 of FIG. 1 according to an embodiment of the disclosure.

Referring to FIG. 1, the electronic device 100 may include a pair of housing structures 110 and 120 (e.g., foldable housing structures) that are coupled to pivot around a hinge structure (e.g., a hinge structure 164 of FIG. 3) so as to be folded relative to each other, a hinge cover (e.g., a hinge cover 165 of FIG. 2) that covers foldable portions of the pair of housing structures 110 and 120, and a display 130 (e.g., a flexible display or a foldable display) that is disposed in a space formed by the pair of housing structures 110 and 120. In this disclosure, a surface on which the display 130 is disposed may be defined as a front surface of the electronic device 100, and a surface opposite to the front surface may be defined as a rear surface of the electronic device 100. Furthermore, surfaces surrounding a space between the front surface and the rear surface may be defined as side surfaces of the electronic device 100.

In an embodiment, the pair of housing structures 110 and 120 may include the first housing structure 110 including a sensor area 131d, the second housing structure 120, a first back cover 140, and a second back cover 150. The pair of housing structures 110 and 120 of the electronic device 100 are not limited to the form and the coupling illustrated in FIGS. 1 and 2 and may be implemented by a combination and/or coupling of other shapes or parts. For example, in another embodiment, the first housing structure 110 and the first back cover 140 may be integrated with each other, and the second housing structure 120 and the second back cover 150 may be integrated with each other.

According to an embodiment, the first housing structure 110 and the second housing structure 120 may be disposed on opposite sides of a folding axis (an axis F) and may have shapes that are entirely symmetric to each other with respect to the folding axis (the axis F). According to an embodiment, the angle or distance that the first housing structure 110 and the second housing structure 120 form may vary depending on whether the electronic device 100 is in a flat state (or, a closing state), a folded state, or an intermediate state. According to an embodiment, unlike the second housing structure 120, the first housing structure 110 may additionally include the sensor area 131d in which various sensors are disposed, but may have a mutually symmetrical shape in the other area. According to another embodiment, the sensor area 131d may be additionally disposed in, or replaced with, at least a partial area of the second housing structure 120.

In an embodiment, the first housing structure 110, in a flat state of the electronic device 100, may be connected to the hinge structure (e.g., the hinge structure 164 of FIG. 3) and may include a first surface 111 disposed to face toward the front surface of the electronic device 100, a second surface 112 facing away from the first surface 111, and a first side member 113 surrounding at least part of a space between the first surface 111 and the second surface 112. In an embodiment, the first side member 113 may include a first side surface 113a disposed parallel to the folding axis (the axis F), a second side surface 113b extending from one end of the first side surface 113a in a direction perpendicular to the folding axis, and a third side surface 113c extending from an opposite end of the first side surface 113a in the direction perpendicular to the folding axis (the axis F).

In an embodiment, the second housing structure 120, in the flat state of the electronic device 100, may be connected to the hinge structure (e.g., the hinge structure 164 of FIG. 3) and may include a third surface 121 disposed to face toward the front surface of the electronic device 100, a fourth surface 122 facing away from the third surface 121, and a second side member 123 surrounding at least part of a space between the third surface 121 and the fourth surface 122. In an embodiment, the second side member 123 may include a fourth side surface 123a disposed parallel to the folding axis (the axis F), a fifth side surface 123b extending from one end of the fourth side surface 123a in a direction perpendicular to the folding axis (the axis F), and a sixth side surface 123c extending from an opposite end of the fourth side surface 123a in the direction perpendicular to the folding axis (the axis F). In an embodiment, the third surface 121, in a folded state, may face the first surface 111.

In an embodiment, the electronic device 100 may include a recess 101 formed to receive the display 130 through a structural shape coupling of the first housing structure 110 and the second housing structure 120. The recess 101 may have substantially the same size as the display 130. In an embodiment, due to the sensor area 131d, the recess 101 may have two or more different widths in the direction perpendicular to the folding axis (the axis F). For example, the recess 101 may have a first width W1 between a first portion 120a of the second housing structure 120 that is parallel to the folding axis (the axis F) and a first portion 110a of the first housing structure 110 that is formed on the periphery of the sensor area 131d and a second width W2 formed by a second portion 120b of the second housing structure 120 and a second portion 110b of the first housing structure 110 that does not correspond to the sensor area 131d and that is parallel to the folding axis (the axis F). In this case, the second width W2 may be formed to be greater than the first width W1. For example, the recess 101 may be formed to have the first width W1 between the first portion 110a of the first housing structure 110 and the first portion 120a of the second housing structure 120 that have mutually asymmetric shapes and the second width W2 between the second portion 110b of the first housing structure 110 and the second portion 120b of the second housing structure 120 that have mutually symmetric shapes. In an embodiment, the first portion 110a and the second portion 110b of the first housing structure 110 may be formed to have different distances from the folding axis (the axis F). The width of the recess 101 is not limited to the illustrated example. In various embodiments, the recess 101 may have two or more different widths due to the form of the sensor area 131d or the asymmetrically-shaped portions of the first housing structure 110 and the second housing structure 120.

In an embodiment, at least part of the first housing structure 110 and at least part of the second housing structure 120 may be formed of a metallic material or a non-metallic material that has a stiffness selected to support the display 130.

In an embodiment, the sensor area 131d may be formed to have a predetermined area adjacent to one corner of the first housing structure 110. However, the arrangement, shape, or size of the sensor area 131d is not limited to the illustrated example. For example, in another embodiment, the sensor area 131d may be provided in another corner of the first housing structure 110 or in any area between an upper corner and a lower corner of the first housing structure 110. In another embodiment, the sensor area 131d may be disposed in at least a partial area of the second housing structure 120. In another embodiment, the sensor area 131d may be disposed to extend to the first housing structure 110 and the second housing structure 120. In an embodiment, the electronic device 100 may include parts that perform various functions and that are disposed to be exposed on the front surface of the electronic device 100 though the sensor area 131d or through one or more openings formed in the sensor area 131d. In various embodiments, the parts may include, for example, at least one of a front camera device, a receiver, a proximity sensor, an illuminance sensor, an iris recognition sensor, an ultrasonic sensor, or an indicator.

In an embodiment, the first back cover 140 may be disposed on the second surface 112 of the first housing structure 110 and may have a substantially rectangular periphery. In an embodiment, at least part of the periphery may be surrounded by the first housing structure 110. Similarly, the second back cover 150 may be disposed on the fourth surface 122 of the second housing structure 120, and at least part of the periphery of the second back cover 150 may be surrounded by the second housing structure 120.

In the illustrated embodiment, the first back cover 140 and the second back cover 150 may have substantially symmetrical shapes with respect to the folding axis (the axis F). In another embodiment, the first back cover 140 and the second back cover 150 may include various different shapes. In another embodiment, the first back cover 140 may be integrally formed with the first housing structure 110, and the second back cover 150 may be integrally formed with the second housing structure 120.

In an embodiment, the first back cover 140, the second back cover 150, the first housing structure 110, and the second housing structure 120 may provide, through a mutually coupled structure, a space in which various parts (e.g., a printed circuit board, an antenna module, a sensor module, or a battery) of the electronic device 100 are disposed. In an embodiment, one or more parts may be disposed, or visually exposed, on the rear surface of the electronic device 100. For example, one or more parts or sensors may be visually exposed through a first rear area 141 of the first back cover 140. In various embodiments, the sensors may include a proximity sensor, a rear camera device, and/or a flash. In another embodiment, at least part of a sub-display 152 may be visually exposed through a second rear area 151 of the second back cover 150. In another embodiment, the electronic device 100 may include a speaker module 153 disposed through at least a partial area of the second back cover 150.

The display 130 may be disposed on the space formed by the pair of housing structures 110 and 120. For example, the display 130 may be mounted in the recess 101 formed by the pair of housing structures 110 and 120 and may be disposed to occupy substantially the entire front surface of the electronic device 100. Accordingly, the front surface of the electronic device 100 may include the display 130, and a partial area (e.g., a peripheral area) of the first housing structure 110 and a partial area (e.g., a peripheral area) of the second housing structure 120 that are adjacent to the display 130. In an embodiment, the rear surface of the electronic device 100 may include the first back cover 140, a partial area (e.g., a peripheral area) of the first housing structure 110 that is adjacent to the first back cover 140, the second back cover 150, and a partial area (e.g., a peripheral area) of the second housing structure 120 that is adjacent to the second back cover 150.

In an embodiment, the display 130 may refer to a display, at least a partial area of which is able to be deformed into a flat surface or a curved surface. In an embodiment, the display 130 may include a folding area 131c, a first area 131a disposed on one side of the folding area 131c (e.g., on a right side of the folding area 131c), and a second area 131b disposed on an opposite side of the folding area 131c (e.g., on a left side of the folding area 131c). For example, the first area 131a may be disposed on the first surface 111 of the first housing structure 110, and the second area 131b may be disposed on the third surface 121 of the second housing structure 120. In an embodiment, the division of the display 130 into the areas is illustrative, and the display 130 may be divided into a plurality of areas (e.g., four or more areas, or two areas) depending on the structure or function of the display 130. For example, in the embodiment illustrated in FIG. 1, the areas of the display 130 may be divided from each other by the folding area 131c or the folding axis (the axis F) that extends parallel to the y axis. However, in another embodiment, the display 130 may be divided into areas with respect to a different folding area (e.g., a folding area parallel to the x axis) or a different folding axis (e.g., a folding axis parallel to the x axis). The above-described division of the display 130 into the areas may be merely a physical division by the pair of housing structures 110 and 120 and the hinge structure (e.g., the hinge structure 164 of FIG. 3), and one full screen may be displayed on the display 130 substantially through the pair of housing structures 110 and 120 and the hinge structure (e.g., the hinge structure 164 of FIG. 3). In an embodiment, the first area 131a and the second area 131b may have shapes that are entirely symmetric to each other with respect to the folding area 131c. However, unlike the second area 131b, the first area 131a may include a notch area (e.g., a notch area 133 of FIG. 3) that is cut depending on the presence of the sensor area 131d, but in the other area, the first area 131a may have a shape that is symmetric to the second area 131b. For example, the first area 131a and the second area 131b may include a portion having a symmetrical shape and a portion having an asymmetrical shape.

Figure 3:
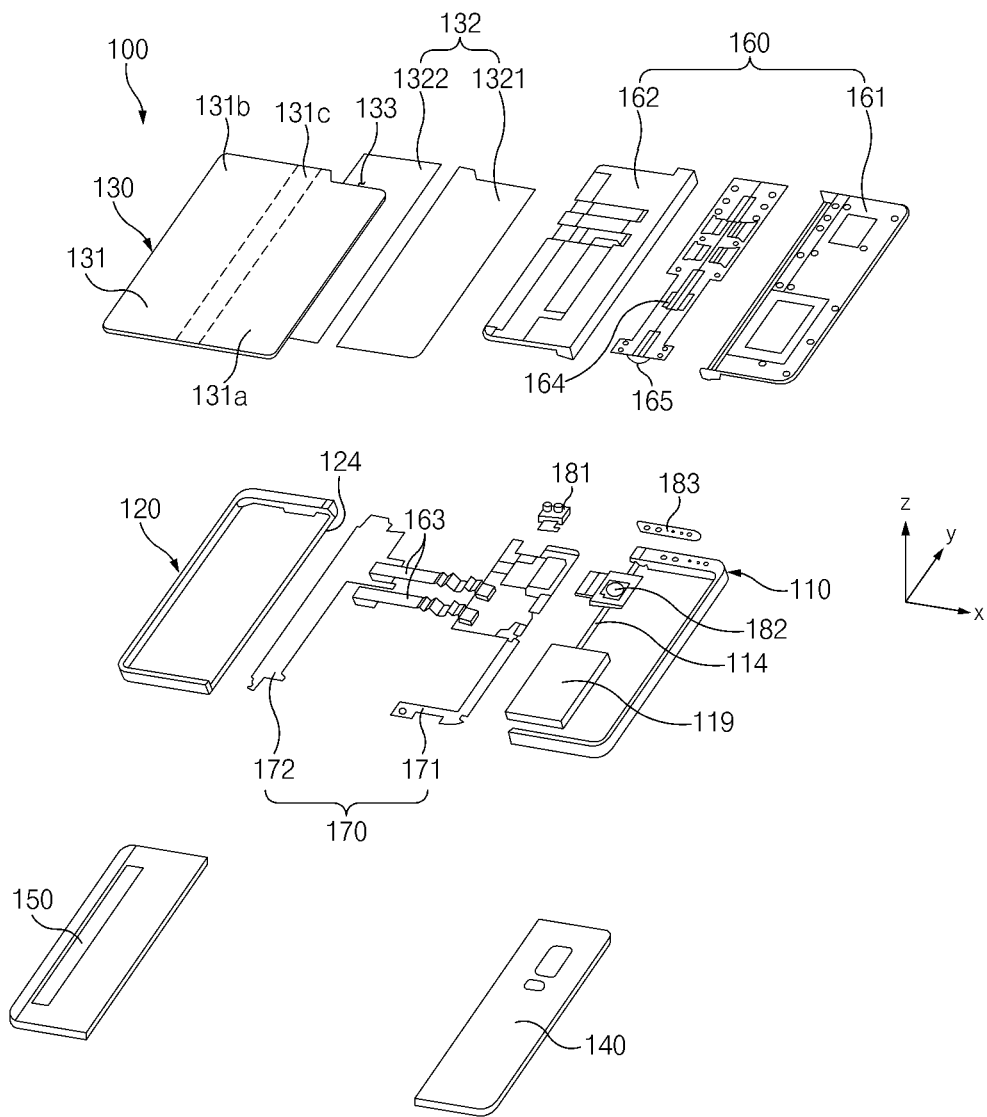
FIG. 3 is an exploded perspective view of the electronic device according to an embodiment of the disclosure.

Referring to FIG. 2, the hinge cover 165 may be disposed between the first housing structure 110 and the second housing structure 120 and may be configured to hide an internal part (e.g., the hinge structure 164 of FIG. 3). In an embodiment, the hinge cover 165 may be hidden by a portion of the first housing structure 110 and a portion of the second housing structure 120, or may be exposed to the outside, depending on an operational state (a flat state or a folded state) of the electronic device 100.

For example, when the electronic device 100 is in a flat state as illustrated in FIG. 1, the hinge cover 165 may not be exposed by being hidden by the first housing structure 110 and the second housing structure 120. In another example, when the electronic device 100 is in a folded state (e.g., a fully folded state) as illustrated in FIG. 2, the hinge cover 165 may be exposed to the outside from between the first housing structure 110 and the second housing structure 120. In another example, when the electronic device 100 is in an intermediate state in which the first housing structure 110 and the second housing structure 120 are folded with a certain angle, the hinge cover 165 may be at least partially exposed to the outside of the electronic device 100 from between the first housing structure 110 and the second housing structure 120. In this case, the exposed area may be smaller than that in the fully folded state. In an embodiment, the hinge cover 165 may include a curved surface.

Hereinafter, operations of the first housing structure 110 and the second housing structure 120 and the areas of the display 130 depending on an operational state (e.g., a flat state or a folded state) of the electronic device 100 will be described.

In an embodiment, when the electronic device 100 is in a flat state (e.g., the state of FIG. 1), the first housing structure 110 and the second housing structure 120 may form an angle of 180 degrees therebetween, and the first area 131a and the second area 131b of the display 130 may be disposed to face the same direction. Furthermore, the folding area 131c, together with the first area 131a and the second area 131b, may form the same plane. In another embodiment, when the electronic device 100 is in the flat state, the first housing structure 110 and the second housing structure 120 may rotate relative to each other through an angle of 360 degrees and may be oppositely folded such that the second surface 112 and the fourth surface 122 face each other.

In an embodiment, when the electronic device 100 is in a folded state (e.g., the state of FIG. 2), the first housing structure 110 and the second housing structure 120 may be disposed to face each other. The first area 131a and the second area 131b of the display 130 may face each other while forming a narrow angle (e.g., between 0 degrees and 10 degrees). At least part of the folding area 131c may be formed to be a curved surface having a predetermined curvature.

In an embodiment, when the electronic device 100 is in an intermediate state, the first housing structure 110 and the second housing structure 120 may be disposed at a certain angle. The first area 131a and the second area 131b of the display 130 may form an angle that is larger than that in the folded state and is smaller than that in the flat state. At least part of the folding area 131c may be formed to be a curved surface having a predetermined curvature. In this case, the curvature may be smaller than that in the folded state.

FIG. 3 is an exploded perspective view of the electronic device 100 according to an embodiment of the disclosure.

Referring to FIG. 3, in an embodiment, the electronic device 100 may include the display 130, a support member assembly 160, at least one printed circuit board 170, the first housing structure 110, the second housing structure 120, the first back cover 140, and the second back cover 150. In this disclosure, the display unit 130 may be referred to as a display module or a display assembly.

The display 130 may include a display panel 131 (e.g., a flexible display panel) and at least one plate 132 or layer on which the display panel 131 is mounted. In an embodiment, the plate 132 may be disposed between the display panel 131 and the support member assembly 160. The display panel 131 may be disposed on at least part of one surface of the plate 132. The plate 132 may include a first plate 1321 and a second plate 1322 divided from each other with respect to the hinge structure 164. The plate 132 may include at least one member that cannot be folded together when the first housing structure 110 and the second housing structure 120 are folded and/or unfolded with respect to the hinge structure 164. The plate 132 may include at least one subsidiary material layer (e.g., graphite member) and/or conductive plate (e.g., Cu sheet) that is disposed on a rear surface of the display panel 131. In an embodiment, the plate 132 may be formed in a shape corresponding to the display panel 131. For example, a partial area of the first plate 1321 may be formed in a shape corresponding to the notch area 133 of the display panel 131.

The support member assembly 160 may include a first support member 161, a second support member 162, the hinge structure 164 disposed between the first support member 161 and the second support member 162, the hinge cover 165 covering the hinge structure 164 when the hinge structure 164 is viewed from the outside, and at least one wiring member 163 (e.g., a flexible printed circuit board (FPCB)) across the first support member 161 and the second support member 162.

In an embodiment, the support member assembly 160 may be disposed between the plate 132 and the at least one printed circuit board 170. For example, the first support member 161 may be disposed between the first area 131_a_ of the display 130 and a first printed circuit board 171. The second support member 162 may be disposed between the second area 131_b_ of the display 130 and a second printed circuit board 172.

In an embodiment, the wiring member 163 and at least part of the hinge structure 164 may be disposed inside the support member assembly 160. The wiring member 163 may be disposed in a direction (e.g., the x-axis direction) across the first support member 161 and the second support member 162. The wiring member 163 may be disposed in a direction (e.g., the x-axis direction) perpendicular to the folding axis of the folding area 131_c_ (e.g., the y-axis or the folding axis F of FIG. 1).

In an embodiment, the at least one printed circuit board 170, as mentioned above, may include the first printed circuit board 171 disposed on one side of the first support member 161 and the second printed circuit board 172 disposed on one side of the second support member 162. The first printed circuit board 171 and the second printed circuit board 172 may be disposed in a space formed by the support member assembly 160, the first housing structure 110, the second housing structure 120, the first back cover 140, and the second back cover 150. Parts for implementing various functions of the electronic device 100 may be mounted on the first printed circuit board 171 and the second printed circuit board 172.

In an embodiment, the first housing structure 110 may contain the first printed circuit board 171, a battery 119, at least one sensor module 181, or at least one camera module 182 that is disposed in a space formed through the first support member 161. The first housing structure 110 may include a glass window 183 that is disposed in a position corresponding to the notch area 133 of the display 130 and that protects the at least one sensor module 181 and the at least one camera module 182. In an embodiment, the second housing structure 120 may contain the second printed circuit board 172 disposed in a space formed through the second support member 162. According to an embodiment, the first housing structure 110 and the first support member 161 may be integrated with each other. According to an embodiment, the second housing structure 120 and the second support member 162 may also be integrated with each other.

In an embodiment, the first housing structure 110 may include a first rotation support surface 114, and the second housing structure 120 may include a second rotation support surface 124 corresponding to the first rotation support surface 114. The first rotation support surface 114 and the second rotation support surface 124 may include a curved surface corresponding to the curved surface included in the hinge cover 165.

In an embodiment, when the electronic device 100 is in a flat state (e.g., the state of FIG. 1), the first rotation support surface 114 and the second rotation support surface 124 may cover the hinge cover 165 such that the hinge cover 165 is not exposed, or is minimally exposed, on the rear surface of the electronic device 100. In an embodiment, when the electronic device 100 is in a folded state (e.g., the state of FIG. 2), the first rotation support surface 114 and the second rotation support surface 124 may rotate along the curved surface included in the hinge cover 165 such that the hinge cover 165 is maximally exposed on the rear surface of the electronic device 100.

Figure 4A:
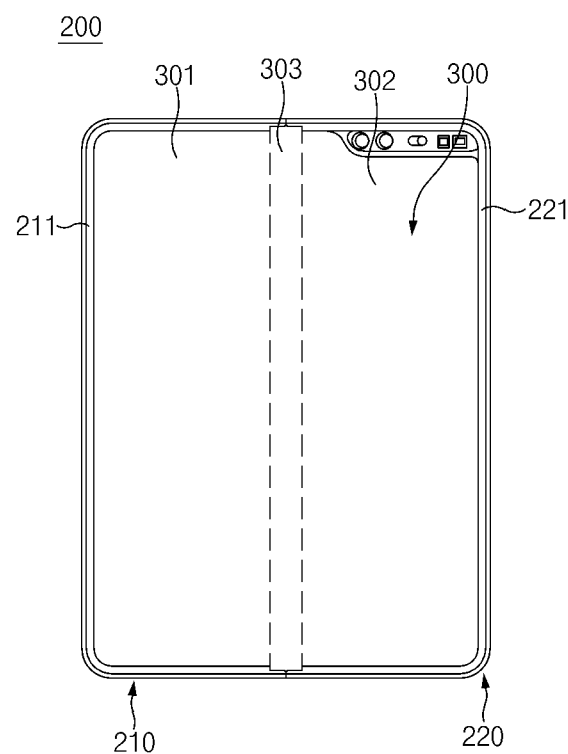
FIGS. 4A and 4B are views illustrating a flat state and a folded state of an electronic device according to various embodiments of the disclosure.
Figure 4B:
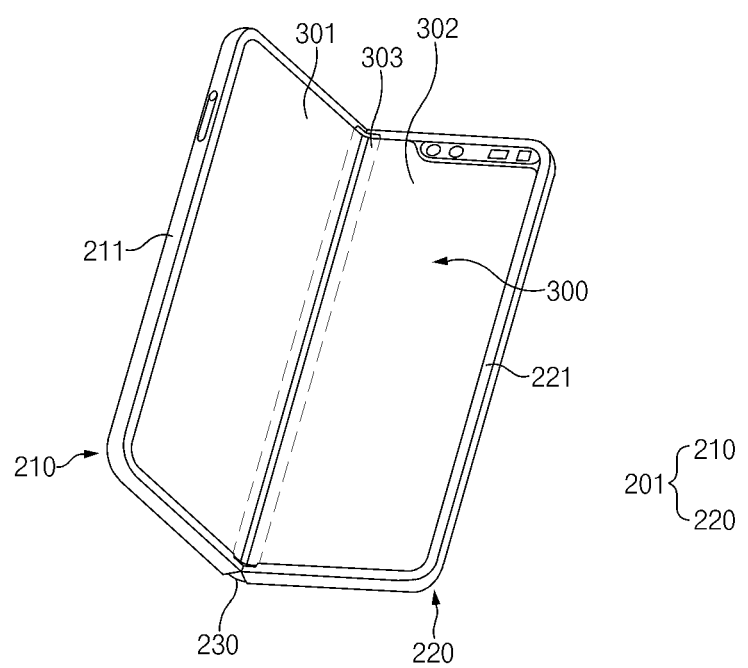

FIGS. 4A and 4B are views illustrating a flat state and a folded state of an electronic device according to various embodiments of the disclosure.

The electronic device 200 disclosed herein may include the flat state (FIG. 4A) and the folded state (FIG. 4B).

In the illustrated embodiment, a display module 300 may include a first portion 301, a second portion 302, and a third portion 303 formed between the first portion 301 and the second portion 302.

In various embodiments, the first portion 301 may be formed to be a flat surface when the electronic device 200 is in the folded state and the flat state. The second portion 302 may be formed to be a flat surface when the electronic device 200 is in the folded state and the flat state. The third portion 303 may be formed to be a flat surface when the electronic device 200 is in the flat state and may be formed to be a curved surface having a predetermined curvature when the electronic device 200 is in the folded state.

In the illustrated embodiment, the flat state may include a state in which the first portion 301 and the second portion 302 face substantially the same direction. That is, the flat state may include a state in which normal vectors of the first portion 301 and the second portion 302 are parallel to each other. The flat state may include a state in which the third portion 303 is formed to be a flat surface.

In the illustrated embodiment, the folded state may include a state in which the first portion 301 and the second portion 302 form a certain angle therebetween. That is, the folded state may include a state in which the normal vectors of the first portion 301 and the second portion 302 form a certain angle therebetween. The folded state may include a state in which the third portion 303 is formed to be a curved surface.

In the illustrated embodiment, the electronic device 200 may include a housing structure 201 that includes a first housing 210 and a second housing 220. The first housing 210 may be formed to surround at least part of the periphery of the first portion 301 and at least part of the periphery of the third portion 303. The first housing 210 may include a first bracket (e.g., first support member 161 of FIG. 3) on which the first portion 301 of the display module 300 is seated and a first frame structure 211 that surrounds the at least part of the periphery of the first portion 301. The second housing 220 may be formed to surround at least part of the periphery of the second portion 302 and at least part of the periphery of the third portion 303. The second housing 220 may include a second bracket (e.g., second support member 162 of FIG. 3) on which the second portion 302 of the display module 300 is seated and a second frame structure 221 that surrounds the at least part of the periphery of the second portion 302.

In some embodiments, the housing structure 201 may further include a hinge structure 230 formed between the first housing 210 and the second housing 220. In the folded state, the hinge structure 230 may be exposed on the exterior of the electronic device 200. In the flat state, the hinge structure 230 may be hidden by the first housing 210 and the second housing 220.

Figure 5A:
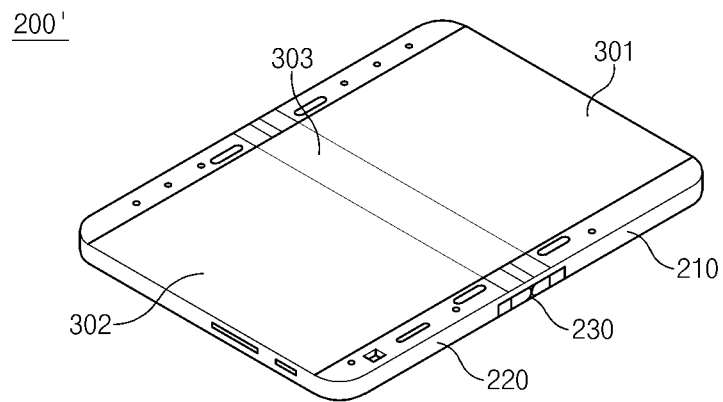
FIGS. 5A, 5B and 5C are views illustrating a flat state and a folded state of an electronic device according to various embodiments of the disclosure.
Figure 5B:
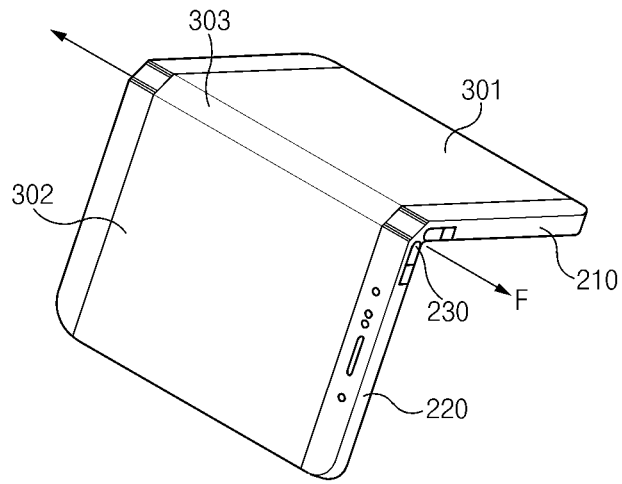
Figure 5C:
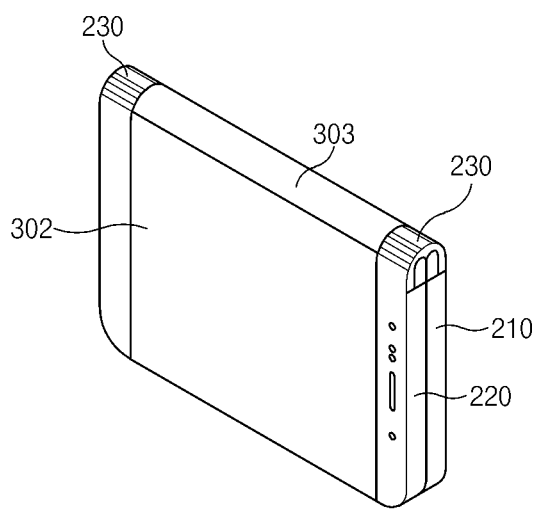

FIGS. 5A to 5C are views illustrating an electronic device according to various embodiments of the disclosure.

In the illustrated embodiment, the display module 300 may include the first portion 301, the second portion 302, and the third portion 303 formed between the first portion 301 and the second portion 302.

In various embodiments, the first portion 301 may be formed to be a flat surface when the electronic device 200' is in a folded state and a flat state. The second portion 302 may be formed to be a flat surface when the electronic device 200' is in the folded state and the flat state. The third portion 303 may be formed to be a flat surface when the electronic device 200' is in the flat state and may be formed to be a curved surface having a predetermined curvature when the electronic device 200' is in the folded state.

Referring to FIG. 5A, the flat state may include a state in which the first portion 301 and the second portion 302 face substantially the same direction. That is, the flat state may include a state in which normal vectors of the first portion 301 and the second portion 302 are parallel to each other. The flat state may include a state in which the third portion 303 is formed to be a flat surface.

Referring to FIGS. 5B and 5C, the folded state may include a state in which the first portion 301 and the second portion 302 form a certain angle therebetween. That is, the folded state may include a state in which the normal vectors of the first portion 301 and the second portion 302 form a certain angle therebetween. The folded state may include a state in which the third portion 303 is formed to be a curved surface.

In various embodiments, the electronic device 200' may include a fully folded state (e.g., FIG. 5C) in which the first portion 301 and the second portion 302 of the display module 300 form a maximum angle therebetween. For example, in the fully folded state, the first portion 301 and the second portion 302 may face opposite directions. That is, the normal vector of the first portion 301 and the normal vector of the second portion 302 may form an angle of 180 degrees therebetween. In this case, the third portion 303 may have a maximum curvature.

In the illustrated embodiment, the electronic device 200' may include the first housing 210, the second housing 220, and the hinge structure 230. The first housing 210 may be formed to surround at least part of the periphery of the first portion 301 and at least part of the periphery of the third portion 303. The second housing 220 may be formed to surround at least part of the periphery of the second portion 302 and at least part of the periphery of the third portion 303.

In the illustrated embodiment, the hinge structure 230 may form one or more axes of rotation such that the first housing 210 and the second housing 220 are folded about a folding axis F.

Figure 6A:
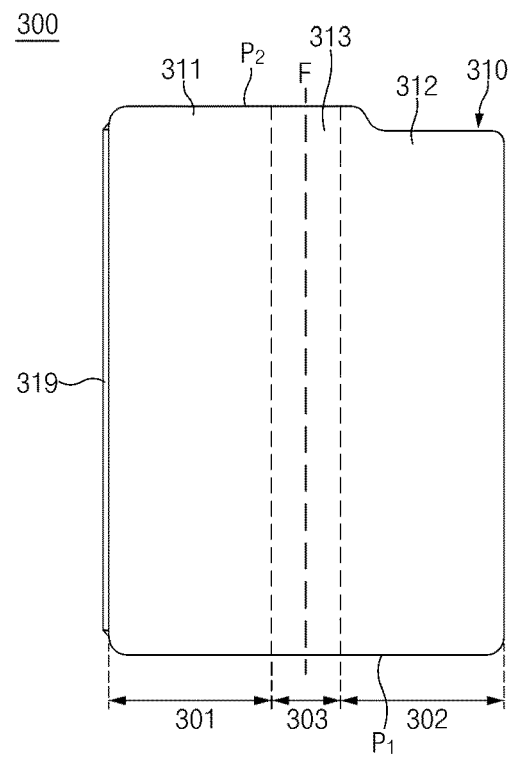
FIGS. 6A and 6B are views illustrating a front surface and a rear surface of a display module according to various embodiments of the disclosure.
Figure 6B:
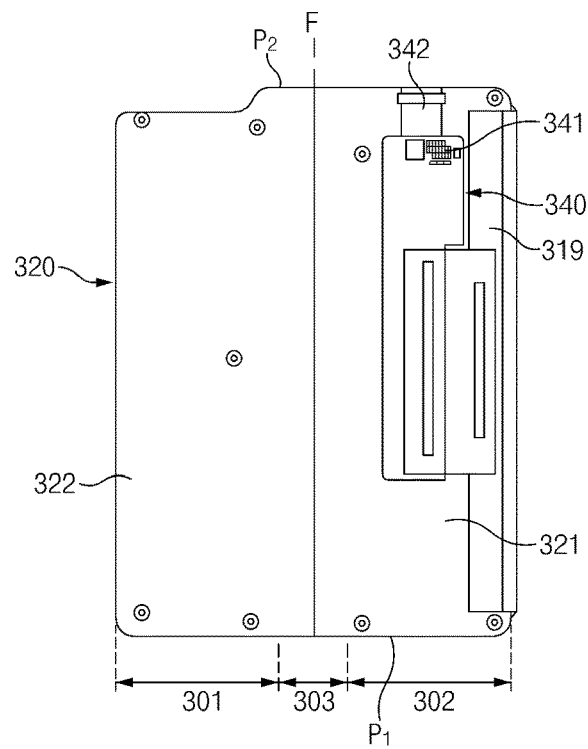

FIGS. 6A and 6B are views illustrating a front surface and a rear surface of the display module according to various embodiments of the disclosure.

In the illustrated embodiment, the display module 300 may include the first portion 301, the second portion 302, and the third portion 303 formed between the first portion 301 and the second portion 302. In the illustrated flat state, the third portion 303 may be formed to be a flat surface. In a folded state, the third portion 303 may be formed to be a curved surface. In this case, the third portion 303 may be folded about the folding axis F. The folding axis F may refer to a virtual axis that connects a first edge P1 and a second edge P2 of the display module 300. The first edge P1 and the second edge P2 may be formed in a direction perpendicular to the folding axis F. The first portion 301 and the second portion 302 may extend from opposite sides of the third portion 303 in directions perpendicular to the folding axis F.

In the illustrated embodiment, the display module 300 may include a plurality of layers. The plurality of layers may include a panel layer 310 and a plate 320 stacked on the panel layer 310. The panel layer 310 may form a front surface of the electronic device 200 in a flat state (e.g., FIG. 4A). In various embodiments, the panel layer 310 may include a layer including a plurality of light emitting elements (e.g., OLED elements), a wiring layer including a plurality of thin film transistors, a polarization layer, and a thin film encapsulation layer. In various embodiments, the panel layer 310 may further include a transparent cover layer that forms the front surface of the display module 300.

In the illustrated embodiment, the plate 320 may include a first plate 321 that corresponds to the first portion 301 and part of the third portion 303 and a second plate 322 that corresponds to the second portion 302 and part of the third portion 303. In various embodiments, the first plate 321 and the second plate 322 may be spaced apart from each other. In some embodiments, the first plate 321 and the second plate 322 may be integrated with each other.

In the illustrated embodiment, the display module 300 may include a connector module 340 electrically connected with at least one layer included in the panel layer 310. The connector module 340 may be electrically connected with an extension 319 that extends from at least one layer (e.g., the wiring layer including the thin film transistors) among the plurality or layers. The connector module 340 may include one or more electric elements 341. The connector module 340 may include a connector 342 connected with a printed circuit board included in the electronic device 200. The one or more electric elements 341 may include a display driver IC. In various embodiments, the connector module 340 may be disposed on the rear surface of the display module 300. For example, the connector module 340 may be disposed on the plate 320.

Figure 7:
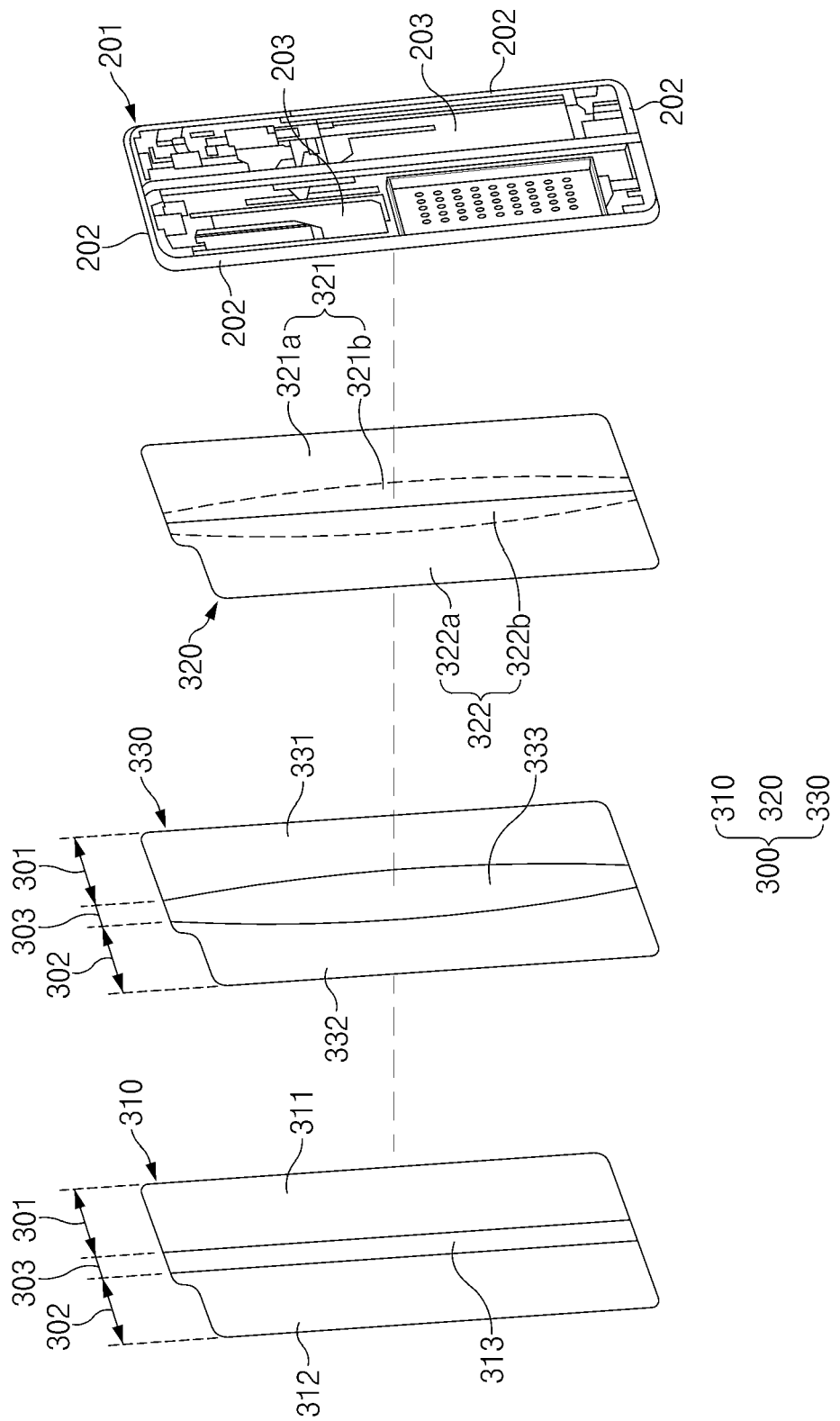
FIG. 7 is a view illustrating a coupling of the display module and a housing structure according to an embodiment of the disclosure.

FIG. 7 is a view illustrating a coupling of the display module and the housing structure according to various embodiments.

In various embodiments, the housing structure 201 may include brackets 203 on which the display module 300 is seated and sidewalls 202 that surround the periphery of the display module 300. In various embodiments, the housing structure 201 may further include back covers (e.g., 140 and 150 of FIG. 3) that form an interior space together with the sidewalls 202 and the brackets 203. Electrical components (e.g., the battery 119 of FIG. 3) and mechanical components (e.g., a printed circuit board) related to functions of the electronic device 200 may be disposed in the interior space.

In the illustrated embodiment, the display module 300 may be coupled to the housing structure 201 such that the plate 320 is seated on the brackets 203 of the housing structure 201. The display module 300 may be coupled to the housing structure 201 such that the periphery of the display module 300 is surrounded by the sidewalls 202 of the housing structure 201.

In the illustrated embodiment, the display module 300 may include the panel layer 310 including a pixel array, the plate 320 configured to support a rear surface of the panel layer 310, and an adhesive layer 330 bonding the panel layer 310 and the plate 320.

In the illustrated embodiment, the panel layer 310 may include a first flat area 311, a second flat area 312, and a folding area 313 formed between the first flat area 311 and the second flat area 312. The first flat area 311 may be included in the first portion 301 of the display module 300. The first flat area 311 may be an area that is formed to be a flat surface in a flat state and a folded state. The second flat area 312 may be included in the second portion 302 of the display module 300. The second flat area 312 may be an area that is formed to be a flat surface in the flat state and the folded state. The folding area 313 may be included in the third portion 303 of the display module 300. The folding area 313 may be a bendable area that is formed to be a flat surface in the flat state and is formed to be a curved surface in the folded state.

In the illustrated embodiment, the plate 320 may include the first plate 321 and the second plate 322. The plate 320 may be disposed on the rear surface of the panel layer 310 to ensure flat surface quality of the panel layer 310. The plate 320 may be configured to support the rear surface of the panel layer 310 such that in the flat state, the panel layer 310 is maintained to be a flat surface.

In various embodiments, the first plate 321 may be attached to the first flat area 311 of the panel layer 310, and at least part of the first plate 321 may extend to the folding area 313 of the panel layer 310. The first plate 321 may include a first attachment area 321a attached to the first flat area 311 and a first extension area 321b extending from the first attachment area 321a to the folding area 313.

In various embodiments, the second plate 322 may be attached to the second flat area 312 of the panel layer 310, and at least part of the second plate 322 may extend to the folding area 313 of the panel layer 310. The second plate 322 may include a second attachment area 322a attached to the second flat area 312 and a second extension area 322b extending from the second attachment area 322a to the folding area 313.

In the illustrated embodiment, the adhesive layer 330 may be disposed between the panel layer 310 and the plate 320 to attach the plate 320 to the rear surface of the panel layer 310. The adhesive layer 330 may include a first area 331, a second area 332, and a third area 333.

In various embodiments, the first area 331 may be included in the first portion 301 of the display module 300. The first area 331 may correspond to part of the first portion 301 of the display module 300. The first area 331 may form the first attachment area 321a of the first plate 321. The first area 331 may bond the first attachment area 321a of the first plate 321 to the rear surface of the panel layer 310. The first area 331 may bond part of the first flat area 311 of the panel layer 310 and the first attachment area 321a of the first plate 321. The first area 331 may be formed to be spaced apart from the second area 332 at a predetermined interval.

In various embodiments, the second area 332 may be included in the second portion 302 of the display module 300. The second area 332 may correspond to part of the second portion 302 of the display module 300. The second area 332 may form the second attachment area 322a of the second plate 322. The second area 332 may bond the second attachment area 322a of the second plate 322 to the rear surface of the panel layer 310. The second area 332 may bond part of the second flat area 312 of the panel layer 310 and the second attachment area 322a of the second plate 322. The second area 332 may be formed to be spaced apart from the first area 331 at the predetermined interval.

In various embodiments, the adhesive layer 330 may include the third area 333 formed between the first area 331 and the second area 332. Part of the third area 333 may be included in the third portion 303 of the display module 300, and the rest of the third area 333 may be included in the first portion 301 and the second portion 302 of the display module 300. The third area 333 may be symmetrically formed with respect to the folding axis F of the display module 300. The third area 333 may correspond to the extension areas 321b and 322b of the plate 320.

In various embodiments, each of the first area 331, the second area 332, and the third area 333 may contain an adhesive material and may provide an adhesive force to the panel layer 310 and the plate 320. For example, the adhesive force of the first area 331 may be substantially the same as the adhesive force of the second area 332. The adhesive force of the third area 33 may differ from the adhesive forces of the first area 331 and the second area 332.

In some embodiments, the third area 333 may be an area that contains an adhesive material, but provides a smaller adhesive force than the first area 331 and the second area 332.

In some embodiments, the third area 333 may be a non-adhesive area that does not contain an adhesive material.

In some embodiments, the third area 333 may be a single-sided adhesive area that provides an adhesive force to the rear surface of the panel layer 310, but does not provide an adhesive force to the plate 320.

In some embodiments, the third area 333 may be an area that contains an adhesive material, but provides a smaller adhesive force than the first area 331 and the second area 332. In this case, the plate 320 may include rigid portions attached to the first area 331 and the second area 332 and a flexible portion attached to the third area 333.

In various embodiments, in the flat state, the third area 333 may be stacked on the extension areas 321b and 322b of the plate 320 so as to face the same direction. In the folded state, the third area 333 may extend in the direction of a tangent surface of the folding area 313 of the panel layer 310 without being stacked on the extension areas 321b and 322b of the plate 320.

Figure 8:
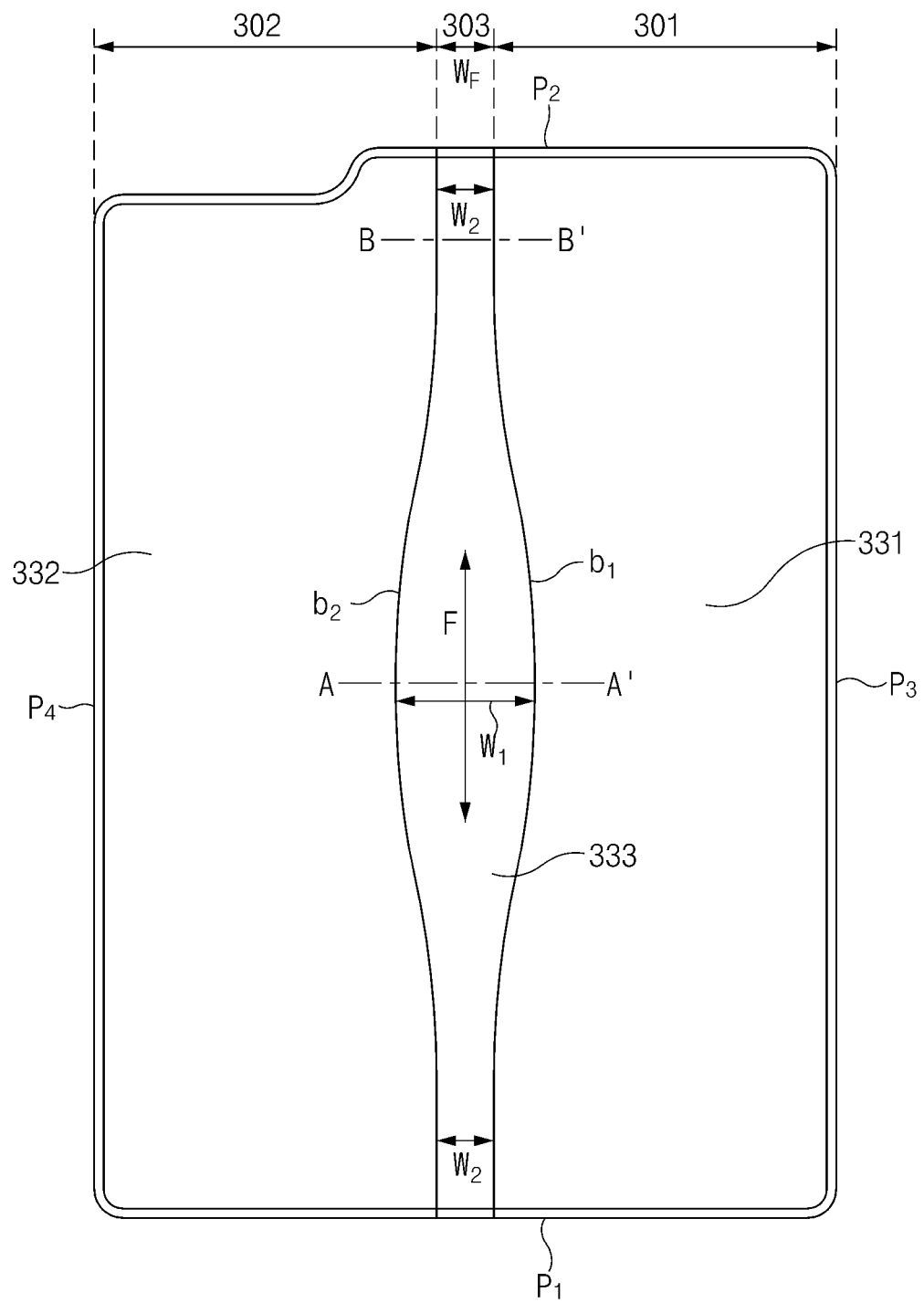
FIG. 8 is a plan view illustrating a panel layer and an adhesive layer of the display module according to an embodiment of the disclosure.

FIG. 8 is a plan view illustrating the panel layer and the adhesive layer of the display module according to an embodiment of the disclosure. FIG. 8 is a rear view of the display module, where the plate is omitted.

In the illustrated embodiment, the adhesive layer 330 may include the first area 331, the third area 333, and the second area 332. The third area 333 may extend from the first edge P1 to the second edge P2 of the display module 300. The first edge P1 and the second edge P2 may be edges that face each other in the direction of the folding axis F. The third area 333 may be formed in a shape that convexly protrudes toward a third edge P3 and a fourth edge P4 with respect to the folding axis F. The first area 331 and the second area 332 may be formed in at least part of the remaining area other than the third area 333. The first area 331 and the second area 332 may be formed to be symmetric to each other with respect to the folding axis F.

In the illustrated embodiment, the width of the first area 331 may be substantially smaller than the width of the first flat area 311 of the panel layer 310. The maximum width of the first area 331 may be smaller than the width of the first flat area 311 of the panel layer 310. That is, the first area 331 may be formed on part of the first flat area 311. The first area 331 may form a first boundary b1 with the third area 333. The first boundary b1 may be formed to be a curve convex toward the third edge P3. The first boundary b1 may be formed in a position spaced apart from the folding axis F at a predetermined interval. The predetermined interval may be decreased from the center of the folding axis F toward the first edge P1 and the second edge P2. The first boundary b1 may be formed to be symmetric to a second boundary b2 with respect to the folding axis F.

In the illustrated embodiment, the width of the second area 332 may be substantially smaller than the width of the second flat area 312 of the panel layer 310. The maximum width of the second area 332 may be smaller than the width of the second flat area 312 of the panel layer 310. That is, the second area 332 may be formed on part of the second flat area 312. The second area 332 may form the second boundary b2 with the third area 333. The second boundary b2 may be formed to be a curve convex toward the fourth edge P4. The second boundary b2 may be formed in a position spaced apart from the folding axis F at a predetermined interval. The predetermined interval may be decreased from the center of the folding axis F toward the first edge P1 and the second edge P2. The second boundary b2 may be formed to be symmetric to the first boundary b1 with respect to the folding axis F.

In various embodiments, the third area 333 may have a decreasing width from the center of the folding axis F toward the first edge P1 and the second edge P2. The third area 333 may have a decreasing width from the center of the folding axis F toward opposite sides of the folding axis F. For example, the third area 333 may have a first width W1 at the central portion thereof and may have a second width W2 at the peripheral portions thereof. In this case, the second width W2 may be smaller than the first width W1.

In the illustrated embodiment, the widths W1 and W2 of the third area 333 may be greater than or equal to the width WF of the third portion 303 of the display module 300. In various embodiments, when in a folded state, the third portion 303 or the folding area 313 is formed to be a curved surface, at least parts (e.g., the first extension area 321b and the second extension area 322b of FIG. 7) of the first plate 321 and the second plate 322 may extend in the direction of a tangent surface of the curved surface to enable the third portion 303 and the folding area 313 to bend.

In various embodiments, when in a flat state, the third portion 303 or the folding area 313 is formed to be a flat surface, the first plate 321 and the second plate 322 may support the rear surface of the panel layer 310 to allow the third portion 303 and the folding area 313 to remain flat.

Figure 9A:
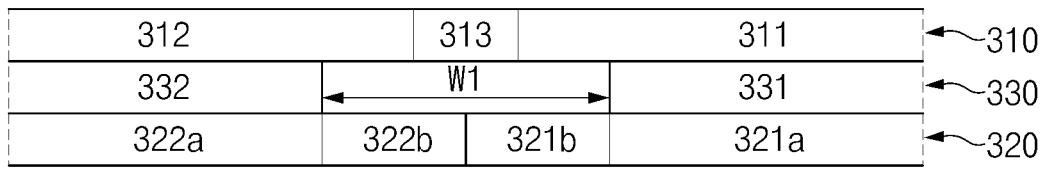
FIGS. 9A and 9B are sectional views of the display module according to various embodiments of the disclosure.
Figure 9B:
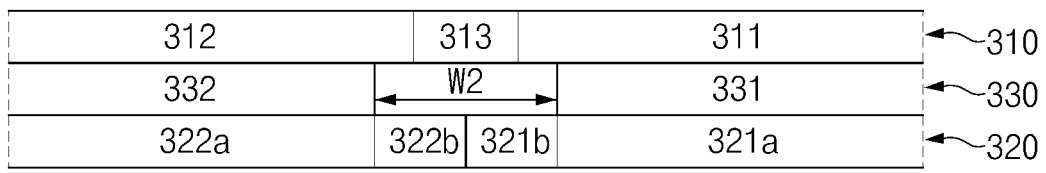

FIGS. 9A and 9B are sectional views of the display module in a flat state according to various embodiments of the disclosure. FIG. 9A is a sectional view taken along line A-A' of FIG. 8, and FIG. 9B is a sectional view taken along line B-B' of FIG. 8.

Referring to FIGS. 9A and 9B, the display module 300 may include the panel layer 310, the adhesive layer 330, and the plate 320.

In the illustrated embodiment, the plate 320 may be attached to the panel layer 310 by the adhesive layer 330. The plate 320 may include the first plate 321 and the second plate 322.

Referring to FIGS. 9A and 9B, the adhesive layer 330 may include the first area 331 and the second area 332. The first area 331 may be attached to the first flat area 311 of the panel layer 310. The second area 332 may be attached to the second flat area 312 of the panel layer 310.

In the illustrated embodiment, the first area 331 may have a smaller area than the first flat area 311 of the panel layer 310. The width of the first area 331 may be smaller than the width of the first flat area 311 of the panel layer 310. The widths may be distances measured from the third edge P3 of the display module 300 in the direction perpendicular to the folding axis F. That is, when the rear surface of the panel layer 310 is viewed from above, the first area 331 may not be formed on part of the first flat area 311 of the panel layer 310 that is adjacent to the folding axis F.

In the illustrated embodiment, the second area 332 may have a smaller area than the second flat area 312 of the panel layer 310. The width of the second area 332 may be smaller than the width of the second flat area 312 of the panel layer 310. The widths may be distances measured from the fourth edge P4 of the display module 300 in the direction perpendicular to the folding axis F. That is, when the rear surface of the panel layer 310 is viewed from above, the second area 332 may not be formed on part of the second flat area 312 of the panel layer 312 that is adjacent to the folding axis F.

In the illustrated embodiment, the first plate 321 may include the first attachment area 321a attached to part of the first flat area 311 of the panel layer 310 and the first extension area 321b extending from the first attachment area 321a to the folding area 313 of the panel layer 310. The first attachment area 321a may be coupled to the first flat area 311 by the first area 331 of the adhesive layer 330. Accordingly, even when the third portion 303 is formed to be a curved surface, the first plate 321 may maintain the default shape thereof. In this case, the default shape may be a shape in a state in which the display module 300 is not folded. For example, the default shape may be a flat surface extending in the direction of a tangent surface of the third portion 303 that is a curved surface.

In the illustrated embodiment, the second plate 322 may include the second attachment area 322a attached to part of the first second area 312 of the panel layer 310 and the second extension area 322b extending from the second attachment area 322a to the folding area 313 of the panel layer 310. The second attachment area 322a may be coupled to the second flat area 312 by the second area 332 of the adhesive layer 330. Accordingly, even when the third portion 303 is formed to be a curved surface, the second plate 322 may maintain the default shape thereof. The default shape may be a shape in a state in which the display module 300 is not folded. For example, the default shape may be a flat surface extending in the direction of a tangent surface of the third portion 303 that is a curved surface.

Comparing FIG. 9A and FIG. 9B, the adhesive layer 330 may include a non-adhesive area formed between the first area 331 and the second area 332. The non-adhesive area may have the first width W1 in the central portion (A-A' of FIG. 8) of the display module 300 and may have the second width W2 in the peripheral portion (B-B' of FIG. 8) of the display module 300. The first width W1 may be greater than the second width W2.

Figure 10A:
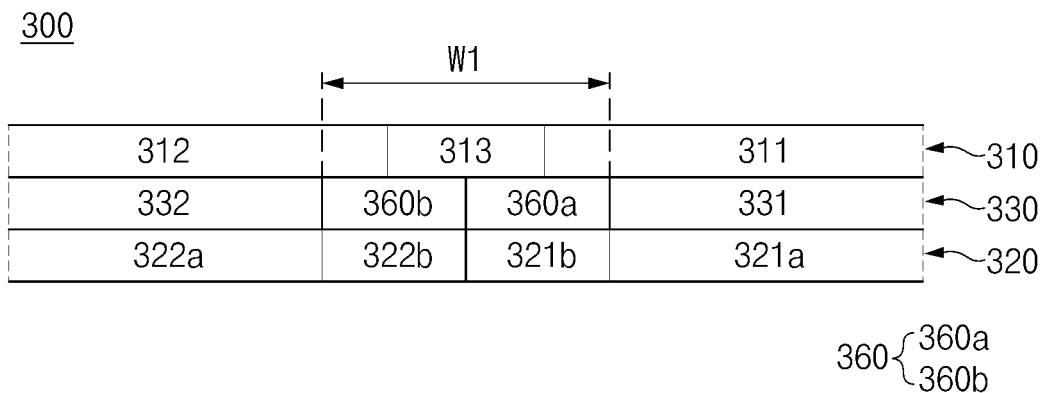
FIGS. 10A and 10B are sectional views of the display module according to various embodiments of the disclosure.
Figure 10B:
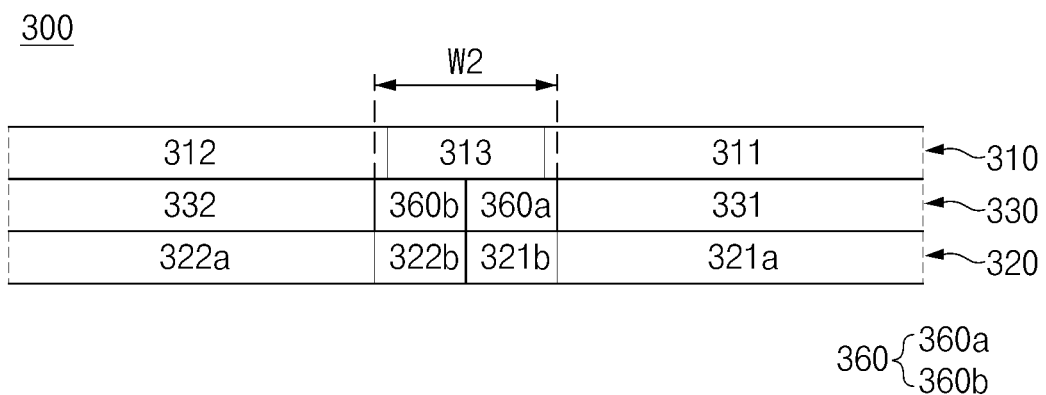

FIGS. 10A and 10B are sectional views of the display module in a flat state according to various embodiments of the disclosure. FIG. 10A is a sectional view taken along line A-A' of FIG. 8, and FIG. 10B is a sectional view taken along line B-B' of FIG. 8. Repetitive descriptions identical to ones given with reference to FIGS. 9A and 9B will be omitted.

Referring to FIGS. 10A and 10B, the display module 300 may include the panel layer 310, the adhesive layer 330, the plate 320, and a thickness compensation layer 360. The thickness compensation layer 360 may contain a polymer material. Alternatively, the thickness compensation layer 360 may contain a metallic material. The thickness compensation layer 360 may prevent the folding area 313 of the panel layer 310 from sagging toward the first plate 321 and the second plate 322. The thickness compensation layer 360 may fill a space between the first area 331 and the second area 332.

In the illustrated embodiment, the thickness compensation layer 360 may be coupled to only one of part of the panel layer 310 or part of the plate 320. For example, the thickness compensation layer 360 may be a single-sided adhesive layer that is attached to only the panel layer 310, but is not attached to the plate 320. Alternatively, the thickness compensation layer 360 may be a single-sided adhesive layer that is attached to only the plate 320, but is not attached to the panel layer 310.

In the illustrated embodiment, the thickness compensation layer 360 may include a first thickness compensation layer 360a disposed between the panel layer 310 and the first extension area 321b of the first plate 321 and a second thickness compensation layer 360b disposed between the panel layer 310 and the second extension area 322b of the second plate 322. A gap may be formed between the first thickness compensation layer 360a and the second thickness compensation layer 360b.

In some embodiments, the first thickness compensation layer 360a and the second thickness compensation layer 360b may be integrated with each other. In this case, the thickness compensation layer 360 may be formed between the first area 331 of the adhesive layer 330 and the second area 332 of the adhesive layer 330.

Comparing FIG. 10A and FIG. 10B, the adhesive layer 330 may include a non-adhesive area formed between the first area 331 and the second area 332. The non-adhesive area may refer to a partial area of the adhesive layer 330 that is not bonded to the plate 320. The non-adhesive area may include the thickness compensation layer 360. The non-adhesive area may have the first width W1 in the central portion (A-A' of FIG. 8) of the display module 300 and may have the second width W2 in the peripheral portion (B-B' of FIG. 8) of the display module 300. The first width W1 may be greater than the second width W2.

Figure 11A:
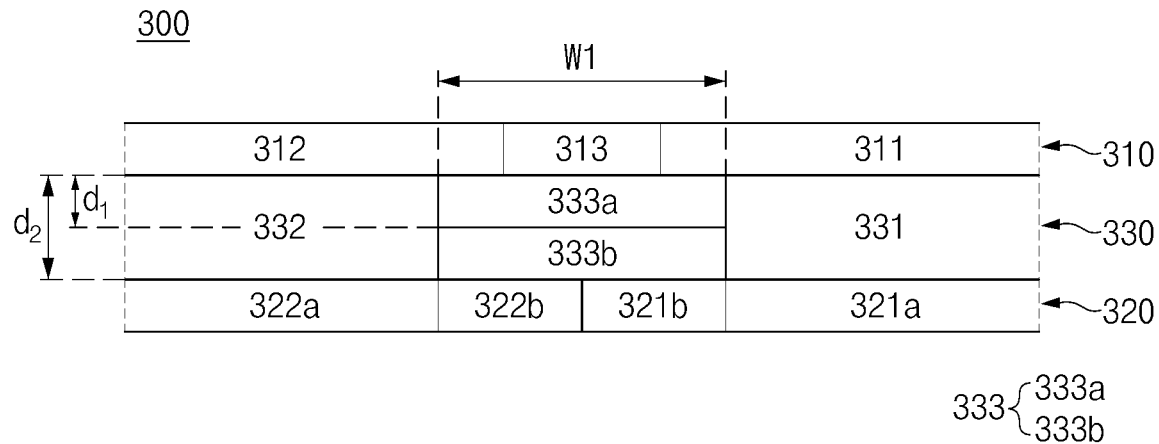
FIGS. 11A and 11B are sectional views of the display module according to various embodiments of the disclosure.
Figure 11B:
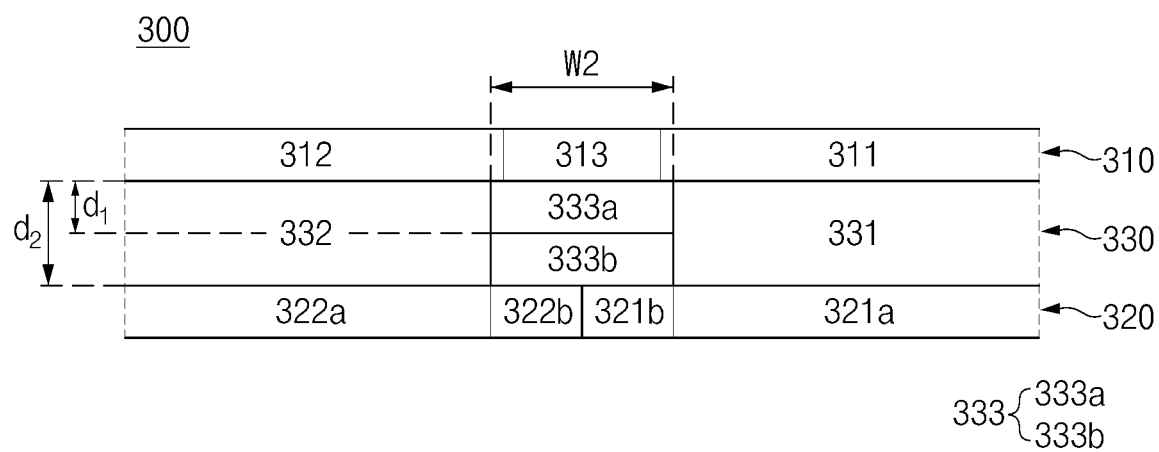

FIGS. 11A and 11B are sectional views of the display module in a flat state according to various embodiments of the disclosure. FIG. 11A is a sectional view taken along line A-A' of FIG. 8, and FIG. 11B is a sectional view taken along line B-B' of FIG. 8. Repetitive descriptions identical to ones given with reference to FIGS. 9A and 9B will be omitted.

Referring to FIGS. 11A and 11B, the display module 300 may include the panel layer 310, the adhesive layer 330, and the plate 320.

In the illustrated embodiment, the adhesive layer 330 may include the first area 331 bonded to part of the first flat area 311 of the panel layer 310, the second area 332 bonded to part of a rear surface of the second flat area 312, and the third area 333 formed between the first area 331 and the second area 332. In this case, the third area 333 may be a single-sided adhesive area that is attached to only the panel layer 310, but is not attached to the plate 320. The width of the third area 333 may be greater than the width of the folding area 313 of the panel layer 310.

In the illustrated embodiment, the widths may be distances measured from the folding axis F toward the third edge P3 and the fourth edge P4 of the display module 300.

In the illustrated embodiment, the third area 333 of the adhesive layer 330 may have a thickness d1 smaller than the thickness d2 of the first area 331 and the second area 332 of the adhesive layer 330.

In the illustrated embodiment, the third area 333 of the adhesive layer 330 may include an adhesive portion 333a and a coating portion 333b. The adhesive portion 333a may be integrally formed with the first area 331 and the second area 332. One surface of the coating portion 333b may be attached to the adhesive portion 333a, and an opposite surface of the coating portion 333b may be brought into contact with the extension areas 321b and 322b of the plate 320. The coating portion 333b may contain a polymer material. Accordingly, the third area 333 of the adhesive layer 330 may be formed of a single-sided adhesive area that does not provide an adhesive force to the plate 320, but provides an adhesive force to only the panel layer 310.

In the illustrated embodiment, the thickness of the coating portion 333b of the third area 333 may be substantially the same as the difference d2−d1 between the thickness d2 of the first area 331 and the second area 332 and the thickness d1 of the third area 333. Accordingly, the folding area 313 of the panel layer 310 may be prevented from sagging toward the first plate 321 and the second plate 322.

Comparing FIG. 11A and FIG. 11B, the adhesive layer 330 may include a non-adhesive area formed between the first area 331 and the second area 332. The non-adhesive area may refer to a partial area of the adhesive layer 330 that is not bonded to the plate 320. The non-adhesive area may include the coating portion 333b and the adhesive portion 333a. The non-adhesive area may have the first width W1 in the central portion (A-A' of FIG. 8) of the display module 300 and may have the second width W2 in the peripheral portion (B-B' of FIG. 8) of the display module 300. The first width W1 may be greater than the second width W2.

Figure 12A:
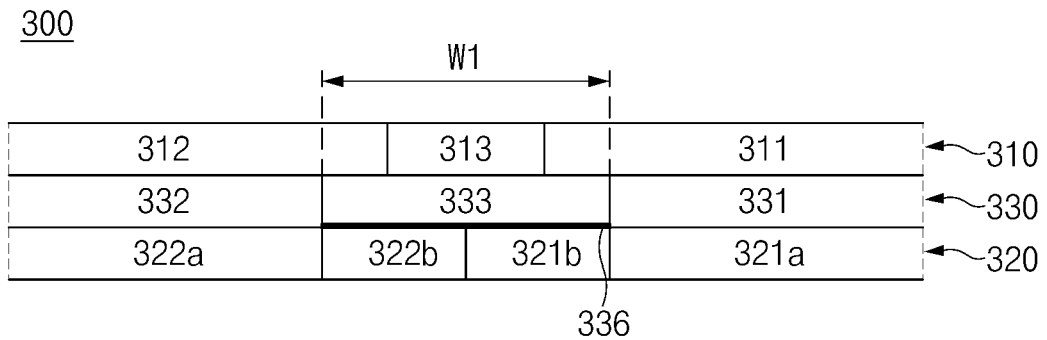
FIGS. 12A and 12B are sectional views of the display module according to various embodiments of the disclosure.
Figure 12B:
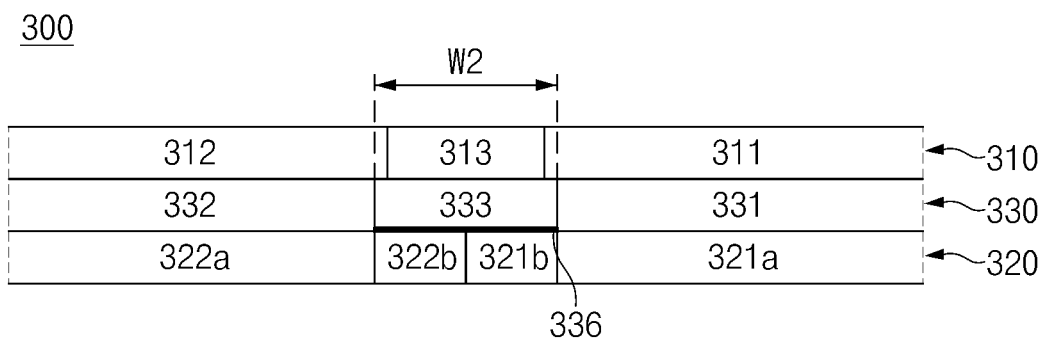

FIGS. 12A and 12B are sectional views of the display module in a flat state according to various embodiments of the disclosure. FIG. 12A is a sectional view taken along line A-A' of FIG. 8, and FIG. 12B is a sectional view taken along line B-B' of FIG. 8. Repetitive descriptions identical to ones given with reference to FIGS. 9A and 9B and FIGS. 11A and 11B will be omitted.

Referring to FIGS. 12A and 12B, the display module 300 may include the panel layer 310, the adhesive layer 330, and the plate 320.

In the illustrated embodiment, the adhesive layer 330 may include the first area 331 bonded to part of the first flat area 311 of the panel layer 310, the second area 332 bonded to part of the second flat area 312, and the third area 333 formed between the first area 331 and the second area 332. In this case, the third area 333 may be a single-sided adhesive area that is attached to only the panel layer 310, but is not attached to the plate 320.

In the illustrated embodiment, the width of the third area 333 may be greater than the width of the folding area 313 of the panel layer 310. The widths may be distances measured from the folding axis F toward the third edge P3 and the fourth edge P4 of the display module 300.

In the illustrated embodiment, the third area 333 of the adhesive layer 330 may include a coating sheet 336 containing a metallic material (e.g., AG, AF, or AL). Alternatively, the coating sheet 336 may contain a polymer material. The coating sheet 336 may contain an ultraviolet (UV) curable material. The coating sheet 336 may include a single-sided sheet in a film form. Accordingly, the third area 333 of the adhesive layer 330 may be formed of a single-sided adhesive area that does not provide an adhesive force to the plate 320, but provides an adhesive force to only the panel layer 310. Furthermore, the thicknesses of the areas 331, 332, and 333 of the adhesive layer 330 may be substantially uniformly formed because the third area 333 of the adhesive layer 330 includes the coating sheet 336 having a thin film form. Accordingly, the folding area 313 of the panel layer 310 may be prevented from sagging toward the first plate 321 and the second plate 322.

Comparing FIG. 12A and FIG. 12B, the adhesive layer 330 may include a non-adhesive area formed between the first area 331 and the second area 332. The non-adhesive area may refer to a partial area of the adhesive layer 330 that is not bonded to the plate 320. The non-adhesive area may include the third area 333 of the adhesive layer 330 and the coating sheet 336 with which the third area 333 is coated. The non-adhesive area may have the first width W1 in the central portion (A-A' of FIG. 8) of the display module 300 and may have the second width W2 in the peripheral portion (B-B' of FIG. 8) of the display module 300. The first width W1 may be greater than the second width W2.

Figure 13A:
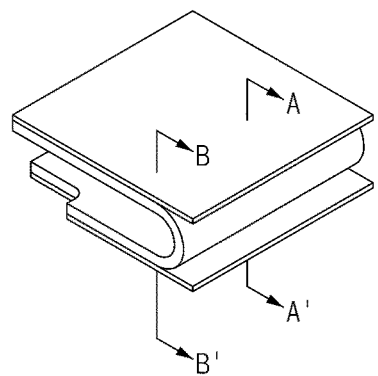
FIGS. 13A, 13B, and 13C are views illustrating a folded state of the display module according to various embodiments of the disclosure.
Figure 13B:
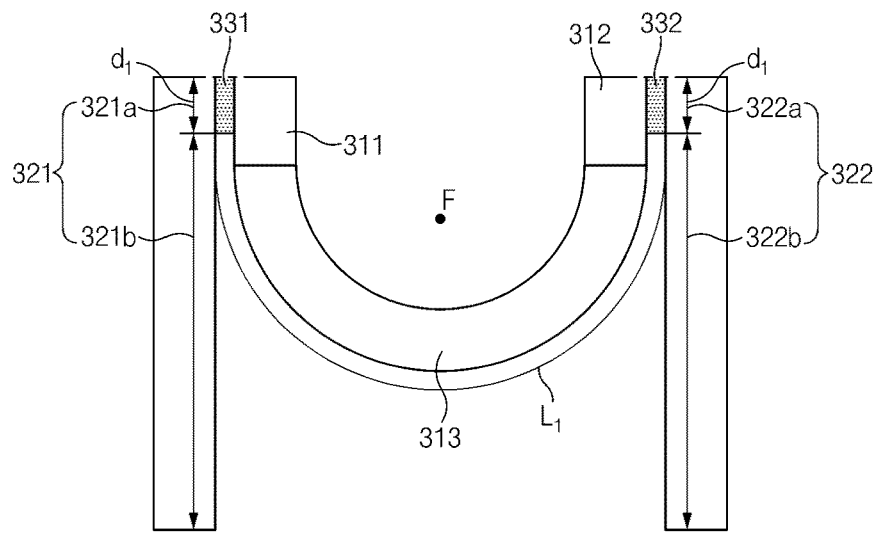
Figure 13C:
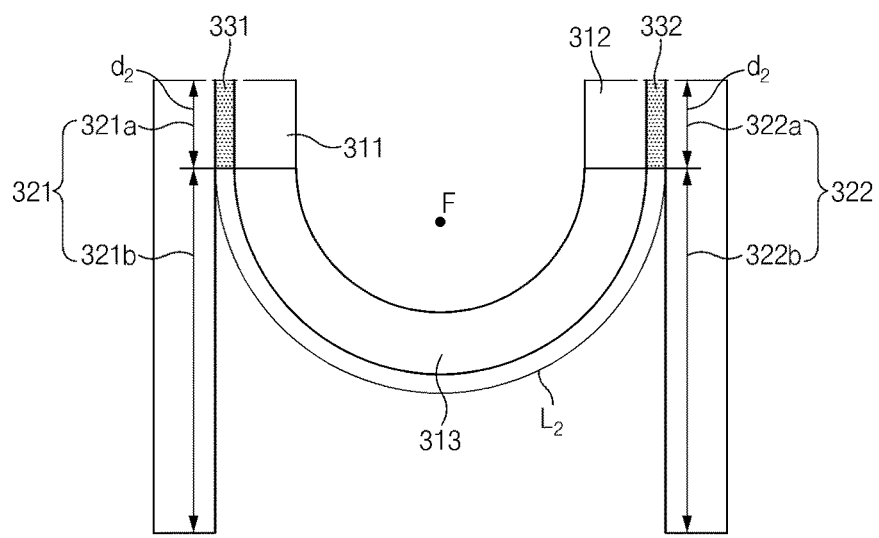

FIGS. 13A to 13C are views illustrating a folded state of the display module according to various embodiments of the disclosure. FIG. 13A is a perspective view illustrating the display module in the folded state. FIG. 13B is a sectional view taken along line A-A' of FIG. 13A. FIG. 13C is a sectional view taken along line B-B' of FIG. 13A.

Referring to FIGS. 13A to 13C, the plate 320 may include the first plate 321 and the second plate 322. Part of the first plate 321 may be attached to the first flat area 311 of the panel layer 310, and part of the second plate 322 may be attached to the second flat area 312 of the panel layer 310.

In the illustrated embodiment, the first plate 321 may include the first attachment area 321a attached to the first flat area 311 and the first extension area 321b extending from the first attachment area 321a to the folding area 313. In the folded state, the first extension area 321b may be separated from the folding area 313 of the panel layer 310. In the folded state, the first extension area 321b may not be attached to the first flat area 311. In the folded state, the first extension area 321b may extend from the first attachment area 321a in the direction of a tangent surface of the folding area 313 of the panel layer 310. In a flat state, the first extension area 321b may face substantially the same direction as the first flat area 311 of the panel layer 310 (e.g., FIG. 9A to FIG. 12B).

In the illustrated embodiment, the second plate 322 may include the second attachment area 322a attached to the second flat area 312 and the second extension area 322b extending from the second attachment area 322a to the folding area 313. In the folded state, the second extension area 322b may not be attached to the second flat area 312. In the folded state, the second extension area 322b may extend from the second attachment area 322a in the direction of a tangent surface of the folding area 313 of the panel layer 310. In the flat state, the second extension area 322b may face substantially the same direction as the second flat area 312 of the panel layer 310 (e.g., FIG. 9A to FIG. 12B).

In various embodiments, the adhesive layer 330 may further include a non-adhesive area that is formed between the first area 331 and the second area 332 and that is not bonded to the plates 321 and 322. Referring to the drawings, the non-adhesive area may be implemented with an opening area. Without being limited thereto, however, the non-adhesive area may be implemented with an adhesive area (e.g., a single-sided adhesive area (e.g., FIGS. 11A and 11B or FIGS. 12A and 12B)) that contains an adhesive material, or a thickness compensation layer (e.g., 360 of FIGS. 10A and 10B).

Referring to FIG. 13B, the first area 331 of the adhesive layer 330 may have a first length d1 from the third edge P3 of the display module 300 in a direction perpendicular to the folding axis F, and the second area 332 of the adhesive layer 330 may have the first length d1 from the fourth edge P4 of the display module 300 in a direction perpendicular to the folding axis F. The non-adhesive area may be spaced apart from end portions of the first area 331 and the second area 332 by a third length L1. The third length L1 may be a length measured along the curved surface of the folding area 313 of the panel layer 310. The third length L1 may be referred to as the first width W1 illustrated in FIG. 8 to FIG. 12B.

Referring to FIG. 13C, the first area 331 of the adhesive layer 330 may have a second length d2 from the third edge P3 in the direction perpendicular to the folding axis F, and the second area 332 of the adhesive layer 330 may have the second length d2 from the fourth edge P4 in the direction perpendicular to the folding axis F. The non-adhesive area may be spaced apart from the end portions of the first area 331 and the second area 332 by a fourth length L2. The fourth length L2 may be a length measured along the curved surface of the folding area 313 of the panel layer 310. The fourth length L2 may be referred to as the second width W2 illustrated in FIG. 8 to FIG. 12B.

In various embodiments, the first length d1 may be smaller than the second length d2. In various embodiments, the third length L1 may be greater than the fourth length L2. That is, the width of the non-adhesive area in the central portion (FIG. 13B) may be greater than the width of the non-adhesive area in the peripheral portion (FIG. 13C). In various embodiments, the non-adhesive area may have a larger area in the central portion than in the peripheral portion.

For example, the non-adhesive area in the central portion (FIG. 13B) may relatively decrease the bonding area between the adhesive layer 330 and the plates 321 and 322 to release stress between the display module 300 and a housing structure (e.g., the housing structure 201 of FIG. 7) when the display module 300 is folded. For example, the non-adhesive area in the peripheral portion (FIG. 13C) may relatively increase the bonding area between the adhesive layer 330 and the plates 321 and 322 to ensure coupling stability of the display module 300 and the housing structure (e.g., the housing structure 201 of FIG. 7) when the display module 300 is folded.

In various embodiments, the widths L1 and L2 of the non-adhesive area in the central portion (FIG. 13B) and the peripheral portion (FIG. 13C) may be associated with the radius of curvature of the display module 300. Specifically, the difference (L1−L2=a) between the widths L1 and L2 may vary depending on the stiffness of the display module 300. For example, the difference "a" may be greater than zero and smaller than (P−L2/2). In this case, "P" may be the width of the first plate 321 or the second plate 322. "L2" may be a minimum width (e.g., the width at the peripheral portion, W2 in FIG. 8) of the non-adhesive area.

Figure 14A:
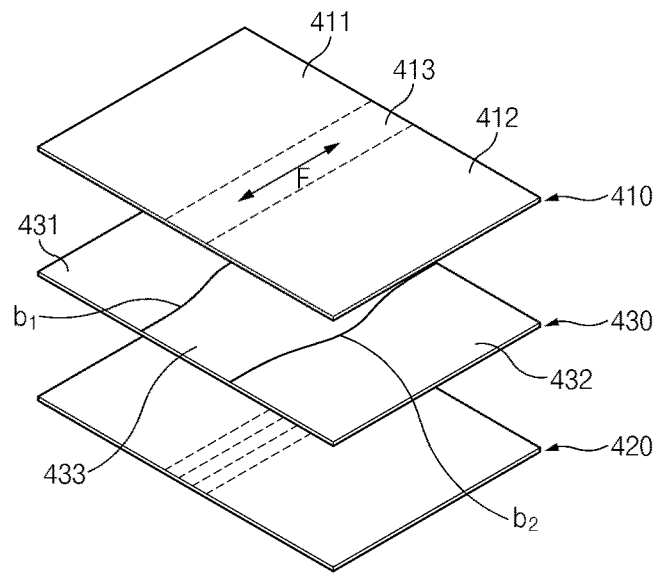
FIGS. 14A and 14B are views illustrating a display module according to various embodiments of the disclosure.
Figure 14B:
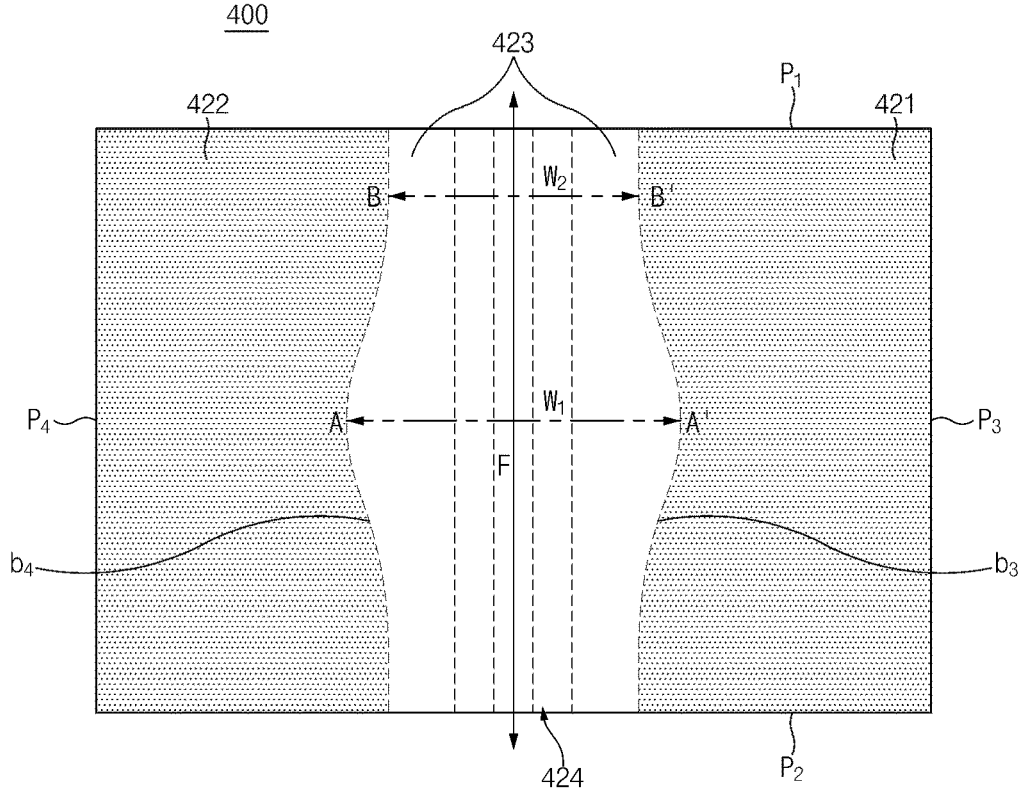

FIGS. 14A and 14B are views illustrating a display module according to various embodiments of the disclosure.

In the illustrated embodiment, the display module 400 may include a plurality of layers. The plurality of layers may include a panel layer 410, an adhesive layer 430 formed on a rear surface of the panel layer 410, and a plate 420 coupled to the rear surface of the panel layer 410 by the adhesive layer 430.

In the illustrated embodiment, the panel layer 410 may include a first flat area 411, a second flat area 412, and a folding area 413. The folding area 413 may be formed to be a curved surface when the display module 400 is in a folded state and may be formed to be a flat surface when the display module 400 is in a flat state.

In the illustrated embodiment, the adhesive layer 430 may include a first area 431, a second area 432, and a third area 433. The first area 431 of the adhesive layer 430 may couple part of the first flat area 411 and a first attachment area 421 of the plate 420. The second area 432 of the adhesive layer 430 may couple part of the second flat area 412 and a second attachment area 422 of the plate 420. The third area 433 of the adhesive layer 430 may be an area that is attached to the rear surface of the panel layer 410, but is not attached to the plate 420. For example, the third area 433 of the adhesive layer 430 may be a single-sided attachment area that provides an adhesive force to only the panel layer 410. In some embodiments, the third area 433 of the adhesive layer 430 may be implemented with an opening area. That is, the first area 431 and the second area 432 may be formed of separate adhesive layers physically separated from each other.

In the illustrated embodiment, the third area 433 of the adhesive layer 430 may be formed of an adhesive area that provides a weaker adhesive force than the first area 431 of the adhesive layer 430 or the second area 432 of the adhesive layer 430.

In the illustrated embodiment, the first area 431 of the adhesive layer 430 may form a first boundary b1 with the third area 433. The first boundary b1 may be formed to be a curve having a predetermined shape. The first boundary b1 may be formed to have a first interval W1 between the first boundary b1 and a second boundary b2 at the central portion of a folding axis F. The first boundary b1 may be formed to have a second interval W2 between the first boundary b1 and the second boundary b2 at the peripheral portions of the folding axis F, the second interval W2 being smaller than the first interval W1.

In the illustrated embodiment, the second area 432 of the adhesive layer 432 may form the second boundary b2 with the third area 433. The second boundary b2 may be formed to be a curve having a predetermined shape. The second boundary b2 may be formed to have the first interval W1 between the first boundary b1 and the second boundary b2 at the central portion of the folding axis F. The second boundary b2 may be formed to have the second interval W2 between the first boundary b1 and the second boundary b2 at the peripheral portions of the folding axis F, the second interval W2 being smaller than the first interval W1.

In the illustrated embodiment, the third area 433 of the adhesive layer 430 may extend from a first edge P1 to a second edge P2 of the display module 400. The first edge P1 or the second edge P2 may be an edge extending in a direction perpendicular to the folding axis F. The third area 433 of the adhesive layer 430 may have a shape in which the central portion is convex toward a third edge P3 and a fourth edge P4.

In the illustrated embodiment, the plate 420 may include the first attachment area 421, the second attachment area 422, and a bending area 423. The bending area 423 may be formed between the first attachment area 421 and the second attachment area 422.

In the illustrated embodiment, the first attachment area 421 may be an area that is coupled to the rear surface of the panel layer 410 by the first area 431 of the adhesive layer 430. The first attachment area 421 may be attached to part of the first area 431 of the adhesive layer 430. The first attachment area 421 may have a third boundary b3 corresponding to the first boundary b1 of the first area 431 of the adhesive layer 430. The first attachment area 421 may have a shape corresponding to the first area 431 of the adhesive layer 430.

In the illustrated embodiment, the second attachment area 422 may be an area that is coupled to the rear surface of the panel layer 410 by the second area 432 of the adhesive layer 430. The second attachment area 422 may be attached to part of the second area 432 of the adhesive layer 430. The second attachment area 422 may have a fourth boundary b4 corresponding to the second boundary b2 of the second area 432 of the adhesive layer 430. The second attachment area 422 may have a shape corresponding to the second area 432 of the adhesive layer 430.

In the illustrated embodiment, the bending area 423 may be formed between the first attachment area 421 and the second attachment area 422. The bending area 423 may be defined by the third boundary b3, the fourth boundary b4, and edges of the plate 420 that are connected with the third boundary b3 and the fourth boundary b4.

In the illustrated embodiment, the bending area 423 may include a plurality of slits 424. The slits 424 may be formed through the plate 420. The plurality of slits 424 may be arranged between the third boundary b3 and the fourth boundary b4 in the direction of the folding axis F. Each of the plurality of slits 424 may be implemented with an opening extending in the direction of the folding axis F. The bending area 423 may be formed in a shape corresponding to the third area 433 of the adhesive layer 430. The bending area 423 may be formed such that the central portion has a greater width than the peripheral portions.

In various embodiments, the width of the folding area 413 of the panel layer 410 may be smaller than the width of the bending area 423 of the plate 420. The width of the folding area 413 of the panel layer 410 may be smaller than the width of the third area 433 of the adhesive layer 430.

Unlike the first plate 321 and the second plate 322 illustrated in FIGS. 6A to 13C, the plate 420 illustrated in FIGS. 14A to 18B may be implemented with a single plate 420 divided into areas.

Figure 15A:
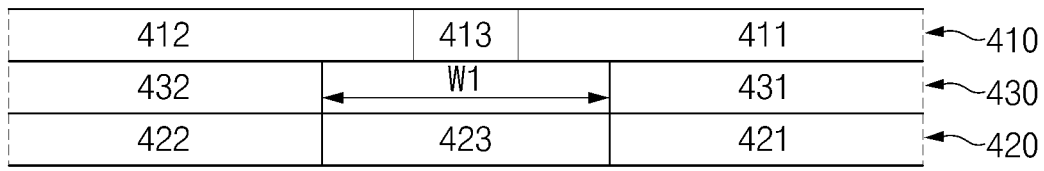
FIGS. 15A and 15B are sectional views of the display module according to various embodiments of the disclosure.
Figure 15B:
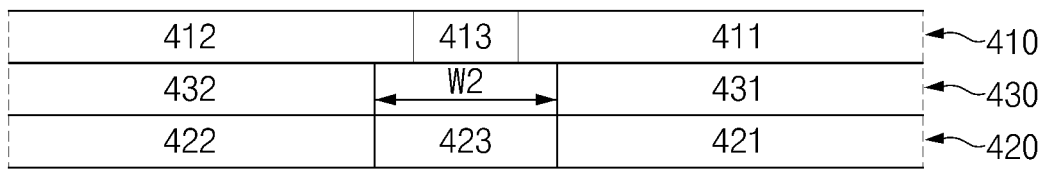

FIGS. 15A and 15B are sectional views of the display module according to various embodiments of the disclosure. FIG. 15A is a sectional view taken along line A-A' of FIG. 14B, and FIG. 15B is a sectional view taken along line B-B' of FIG. 14B.

Referring to FIGS. 15A and 15B, the display module 400 may include the panel layer 410, the adhesive layer 430, and the plate 420, at least part of which is attached to the panel layer 410 by the adhesive layer 430.

Referring to FIGS. 15A and 15B, the adhesive layer 430 may include the first area 431 and the second area 432. The first area 431 of the adhesive layer 430 may be attached to the first flat area 411 of the panel layer 410. The second area 432 of the adhesive layer 430 may be attached to the second flat area 412 of the panel layer 410.

In the illustrated embodiment, the first area 431 of the adhesive layer 430 may have a smaller area than the first flat area 411 of the panel layer 410. The width of the first area 431 may be smaller than the width of the first flat area 411 of the panel layer 410. The widths may be distances measured from the third edge P3 of the display module 400 in the direction perpendicular to the folding axis F. That is, when the rear surface of the panel layer 410 is viewed from above, the first area 431 may not be formed on part of the first flat area 411 of the panel layer 410 that is adjacent to the folding axis F.

In the illustrated embodiment, the second area 432 of the adhesive layer 430 may have a smaller area than the second flat area 412 of the panel layer 410. The width of the second area 432 may be smaller than the width of the second flat area 412 of the panel layer 410. The widths may be distances measured from the fourth edge P4 of the display module 400 in the direction perpendicular to the folding axis F. That is, when the rear surface of the panel layer 410 is viewed from above, the second area 432 may not be formed on part of the second flat area 412 of the panel layer 410 that is adjacent to the folding axis F.

In the illustrated embodiment, the third area 433 of the adhesive layer 430 may be an opening area formed between the first area 431 and the second area 432. The opening area may be formed by the first boundary b1 of the first area 431 and the second boundary b2 of the second area 432. That is, the third area 433 may be open such that the bending area 423 of the plate 420 and the rear surface of the panel layer 410 face each other.

In the illustrated embodiment, the plate 420 may include the first attachment area 421, the second attachment area 422, and the bending area 423. The first attachment area 421 may be coupled to part of the first flat area 411 of the panel layer 410 by the first area 431 of the adhesive layer 430. The second attachment area 422 may be coupled to part of the second flat area 412 of the panel layer 410 by the second area 432 of the adhesive layer 430. The bending area 423 may face the folding area 413, part of the first flat area 411, and part of the second flat area 412 of the panel layer 410. A space may be formed between the bending area 423 and the rear surface of the panel layer 410.

Comparing FIG. 15A and FIG. 15B, the adhesive layer 430 may include the opening area formed between the first area 431 and the second area 432. The opening area may have the first width W1 in the central portion (A-A' of FIG. 14B) of the display module 400 and may have the second width W2 in the peripheral portion (B-B' of FIG. 14B) of the display module 400. The first width W1 may be greater than the second width W2.

Figure 16A:
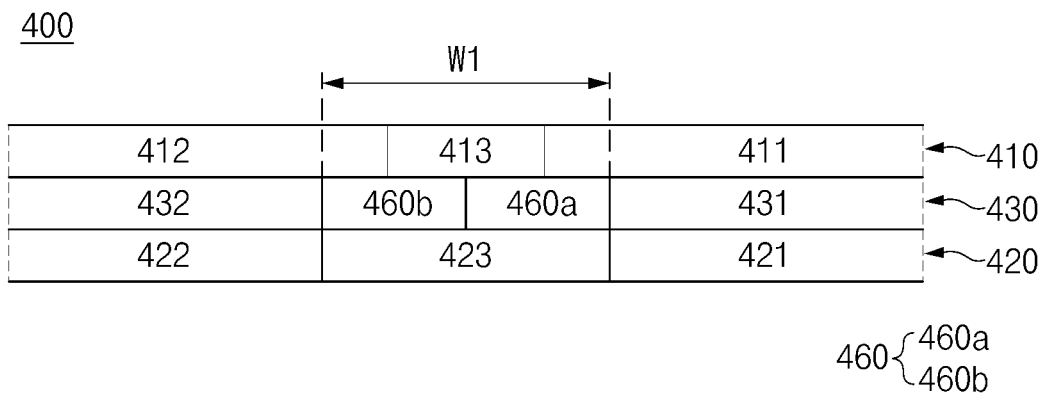
FIGS. 16A and 16B are sectional views of the display module according to various embodiments of the disclosure.
Figure 16B:
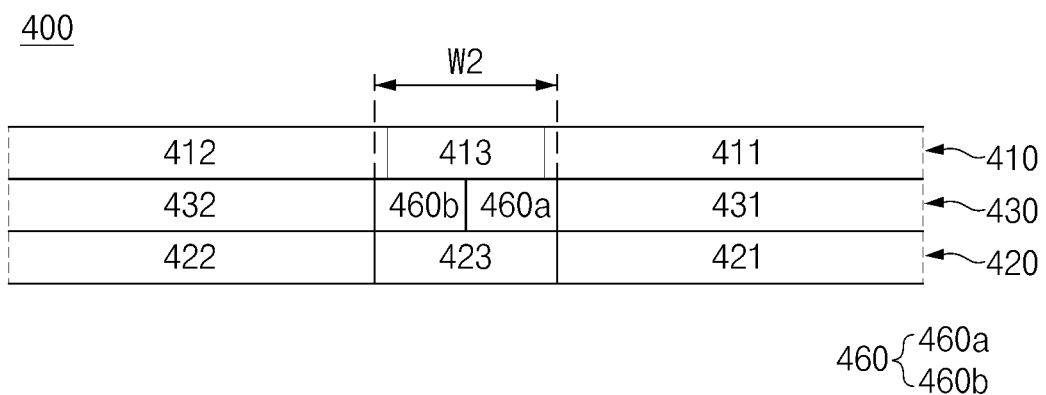

FIGS. 16A and 16B are sectional views of the display module according to various embodiments of the disclosure. FIG. 16A is a sectional view taken along line A-A' of FIG. 14B, and FIG. 16B is a sectional view taken along line B-B' of FIG. 14B. Repetitive descriptions identical to ones given with reference to FIGS. 15A and 15B will be omitted.

Referring to FIGS. 16A and 16B, the display module 400 may include the panel layer 410, the adhesive layer 430, the plate 420, and a thickness compensation layer 460. The thickness compensation layer 460 may contain a polymer material and/or a metallic material. The thickness compensation layer 460 may prevent the folding area 413 of the panel layer 410 from sagging toward the bending area 423 of the plate 420. The thickness compensation layer 460 may fill a space between the first area 431 and the second area 432.

In the illustrated embodiment, the thickness compensation layer 460 may be coupled to only one of part of the panel layer 410 or part of the plate 420. For example, the thickness compensation layer 460 may be a single-sided adhesive layer that is attached to only the panel layer 410, but is not attached to the plate 420. Alternatively, the thickness compensation layer 460 may be a single-sided adhesive layer that is attached to only the plate 420, but is not attached to the panel layer 410.

In the illustrated embodiment, the thickness compensation layer 460 may include a first thickness compensation layer 460a disposed between the panel layer 410 and the bending area 423 of the plate 420 and a second thickness compensation layer 460b disposed between the panel layer 410 and the bending area 423. A gap may be formed between the first thickness compensation layer 460a and the second thickness compensation layer 460b.

In some embodiments, the first thickness compensation layer 460a and the second thickness compensation layer 460b may be integrated with each other. In this case, the thickness compensation layer 460 may be formed between the first area 431 of the adhesive layer 430 and the second area 432 of the adhesive layer 430.

Comparing FIG. 16A and FIG. 16B, the adhesive layer 430 may include a non-adhesive area formed between the first area 431 and the second area 432. The non-adhesive area may refer to a partial area of the adhesive layer 430 that is not bonded to the plate 420. The non-adhesive area may include the thickness compensation layer 460. The non-adhesive area may have the first width W1 in the central portion (A-A' of FIG. 14B) of the display module 400 and may have the second width W2 in the peripheral portion (B-B' of FIG. 14B) of the display module 400. The first width W1 may be greater than the second width W2.

Figure 17A:
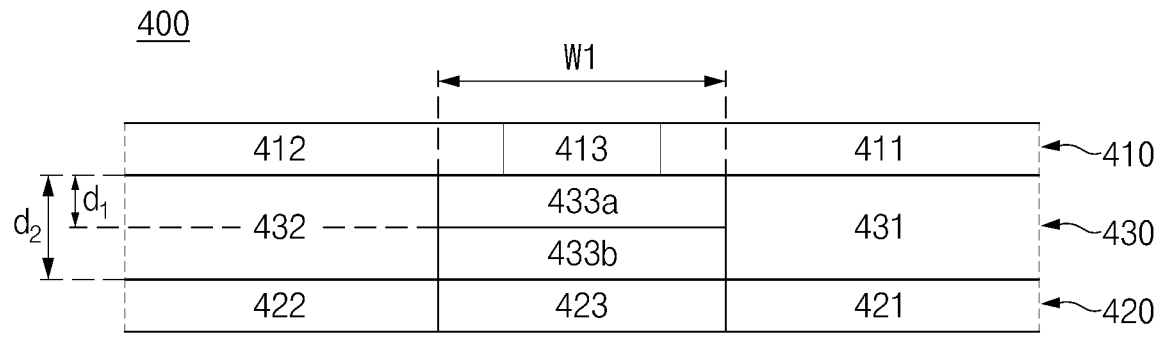
FIGS. 17A and 17B are sectional views of the display module according to various embodiments of the disclosure.
Figure 17B:
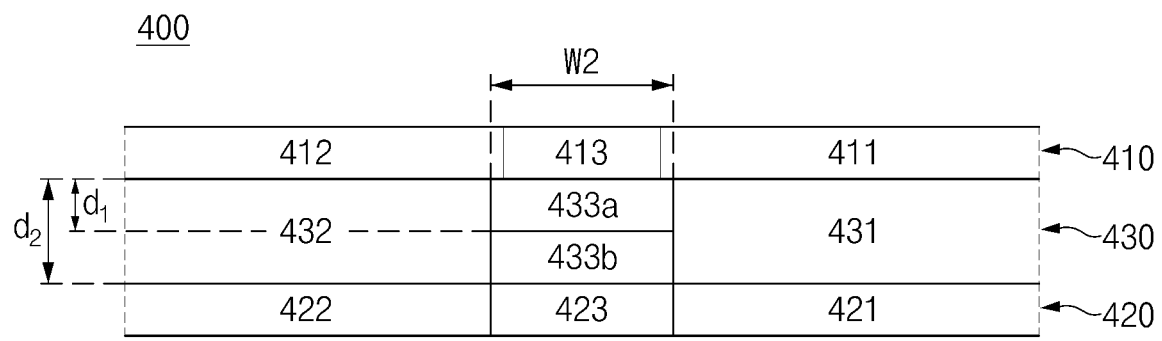

FIGS. 17A and 17B are sectional views of the display module according to various embodiments of the disclosure. FIG. 17A is a sectional view taken along line A-A' of FIG. 14B, and FIG. 17B is a sectional view taken along line B-B' of FIG. 14B. Repetitive descriptions identical to ones given with reference to FIGS. 15A and 15B will be omitted.

Referring to FIGS. 17A and 17B, the display module 400 may include the panel layer 410, the adhesive layer 430, and the plate 420.

In the illustrated embodiment, the adhesive layer 430 may include the first area 431 bonded to part of the first flat area 411 of the panel layer 410, the second area 432 bonded to part of a rear surface of the second flat area 412, and the third area 431 formed between the first area 431 and the second area 432. In this case, the third area 433 may be a single-sided adhesive area that is attached to only the panel layer 410, but is not attached to the plate 420. The width of the third area 433 may be greater than the width of the folding area 413 of the panel layer 410.

In the illustrated embodiment, the widths may be distances measured from the folding axis F toward the third edge P3 and the fourth edge P4 of the display module 400.

In the illustrated embodiment, the third area 433 of the adhesive layer 430 may have a thickness d1 smaller than the thickness d2 of the first area 431 and the second area 432 of the adhesive layer 430.

In the illustrated embodiment, the third area 433 of the adhesive layer 430 may include an adhesive portion 433a and a coating portion 433b. The adhesive portion 433a may be integrally formed with the first area 431 of the adhesive layer 430 and the second area 432 of the adhesive layer 430. One surface of the coating portion 433b may be attached to the adhesive portion 433a, and an opposite surface of the coating portion 433b may be brought into contact with the bending area 423 of the plate 420. The coating portion 433b may contain a polymer material. Accordingly, the third area 433 of the adhesive layer 430 may be formed of a single-sided adhesive area that does not provide an adhesive force to the plate 420, but provides an adhesive force to only the panel layer 410.

In the illustrated embodiment, the thickness of the coating portion 433b of the third area 433 may be substantially the same as the difference d2−d1 between the thickness d2 of the first area 431 and the second area 432 and the thickness d1 of the third area 433. Accordingly, the folding area 413 of the panel layer 410 may be prevented from sagging toward the plate 420.

Comparing FIG. 17A and FIG. 17B, the adhesive layer 430 may include a non-adhesive area (e.g., the third area 433) that is formed between the first area 431 and the second area 432. The non-adhesive area (e.g., the third area 433) may refer to a partial area of the adhesive layer 430 that is not bonded to the plate 420. The non-adhesive area (e.g., the third area 433) may include the coating portion 433b and the adhesive portion 433a. The non-adhesive area (e.g., the third area 433) may have the first width W1 in the central portion (A-A' of FIG. 14B) of the display module 400 and may have the second width W2 in the peripheral portion (B-B' of FIG. 14B) of the display module 400. The first width W1 may be greater than the second width W2.

Figure 18A:
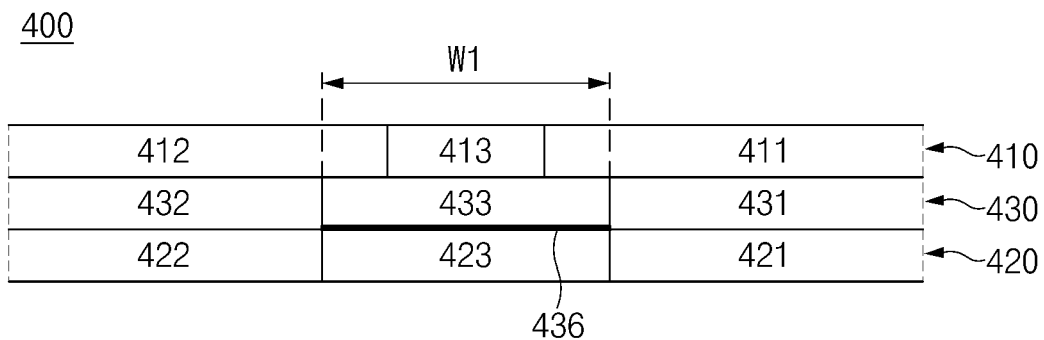
FIGS. 18A and 18B are sectional views of the display module according to various embodiments of the disclosure.
Figure 18B:
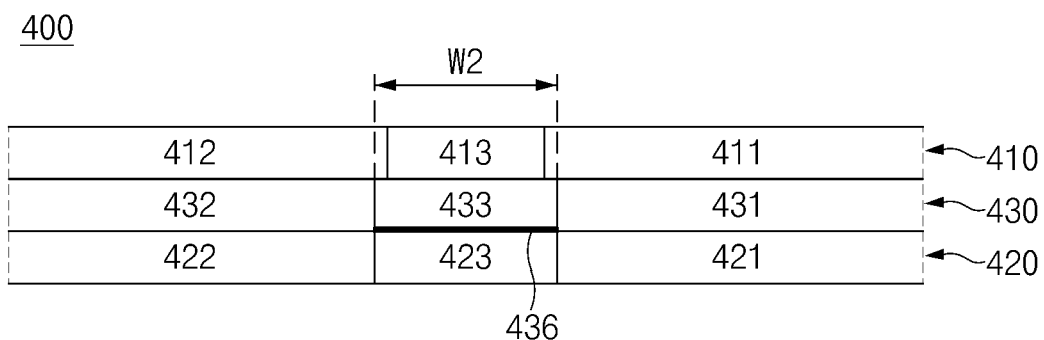

FIGS. 18A and 18B are sectional views of the display module according to various embodiments of the disclosure. FIG. 18A is a sectional view taken along line A-A' of FIG. 14B, and FIG. 18B is a sectional view taken along line B-B' of FIG. 14B. Repetitive descriptions identical to ones given with reference to FIGS. 15A and 15B and FIGS. 16A and 16B will be omitted.

Referring to FIGS. 18A and 18B, the display module 400 may include the panel layer 410, the adhesive layer 430, and the plate 420.

In the illustrated embodiment, the adhesive layer 430 may include the first area 431 bonded to part of the first flat area 411 of the panel layer 410, the second area 432 bonded to part of the second flat area 412, and the third area 433 formed between the first area 431 and the second area 432. In this case, the third area 433 may be a single-sided adhesive area that is attached to only the panel layer 410, but is not attached to the plate 420.

In the illustrated embodiment, the width of the third area 433 may be greater than the width of the folding area 413 of the panel layer 410. The widths may be distances measured from the folding axis F toward the third edge P3 and the fourth edge P4 of the display module 400.

In the illustrated embodiment, the third area 433 of the adhesive layer 430 may include a coating sheet 436. The coating sheet 436 may contain a metallic material (e.g., AG, AF, or AL) and/or a polymer material. The coating sheet 436 may contain a UV curable material. The coating sheet 436 may include a single-sided sheet in a film form. Accordingly, the third area 433 of the adhesive layer 430 may be formed of a single-sided adhesive area that does not provide an adhesive force to the plate 420, but provides an adhesive force to only the panel layer 410. Furthermore, the thicknesses of the areas 431, 432, and 433 of the adhesive layer 430 may be substantially uniformly formed because the third area 433 of the adhesive layer 430 includes the coating sheet 436 having a thin film form. Accordingly, the folding area 413 of the panel layer 410 may be prevented from sagging toward the plate 420.

Comparing FIG. 18A and FIG. 18B, the adhesive layer 430 may include a non-adhesive area that is formed between the first area 431 and the second area 432 and that is not attached to the plate 420. The non-adhesive area may refer to a partial area of the adhesive layer 430 that is not bonded to the plate 420. The non-adhesive area may include the third area 433 of the adhesive layer 430 and the coating sheet 436 with which the third area 433 is coated. The non-adhesive area may have the first width W1 in the central portion (A-A' of FIG. 14B) of the display module 400 and may have the second width W2 in the peripheral portion (B-B' of FIG. 14B) of the display module 400. The first width W1 may be greater than the second width W2.

A display module 300 may include a panel layer 310 including a first edge P1 and a second edge P2 facing the first edge P1, a plate 320 disposed on a rear surface of the panel layer 310, and an adhesive layer 330 disposed between the panel layer 310 and the plate 320. The adhesive layer 330 may include a first area 331 and a second area 332 that provide a first adhesive force, and a third area 333 that provides a second adhesive force different from the first adhesive force and that is disposed between the first area 331 and the second area 332, the third area 333 extending from the first edge P1 to the second edge P2. The third area 333 may have a first width W1 in a central area between the first edge P1 and the second edge P2 and may have a second width W2 in areas adjacent to the first edge P1 and the second edge P2, the second width W2 being different from the first width W1.

In various embodiments, the first adhesive force may be greater than the second adhesive force.

In various embodiments, the first width W1 may be greater than the second width W2.

In various embodiments, the first area 331 and the second area 332 may be formed on at least part of the remaining portion of the rear surface of the panel layer 310 other than the third area 333.

In various embodiments, the third area 333 may have a decreasing width from the central area toward the first edge P1 and the second edge P2.

In various embodiments, the display module 300 may further include a coating sheet 336 formed between the third area 333 and the plate 320 and attached to the third area 333.

In various embodiments, the coating sheet 336 may include a first coating layer containing a UV curable material or a second coating layer containing a metallic material.

In various embodiments, in a section of the display module 300, the thickness of the coating sheet 336 and the thickness of the second area 332 may be substantially the same as the thickness of the first area 331.

In various embodiments, the adhesive layer 330 may contain an adhesive material, and the adhesive material may have a higher density in the third area 333 than in the first area 331 and the second area 332.

In various embodiments, the plate 320 may include a first plate 320 attached to the first area 331 and a second plate 320 attached to the second area 332 and disposed to have a gap between the first plate 320 and the second plate 320.

In various embodiments, each of the first area 331 and the second area 332 may include a double-sided adhesive layer that provides an adhesive force to the rear surface of the panel layer 310 and the plate 320, and the third area 333 may include a single-sided adhesive layer that provides an adhesive force to the rear surface of the panel layer 310.

In various embodiments, when viewed from above the adhesive layer 330, the third area 333 may be formed of an opening area such that the rear surface of the panel layer 310 is exposed.

In various embodiments, the panel layer 310 may include a first flat area 311 and a second flat area 312 formed to be a flat surface, and a folding area 323 formed between the first flat area 311 and the second flat area 312 and formed to be a flat surface or a curved surface. The third area 333 of the adhesive layer 330 may be formed on the folding area 313, and part of the first flat area 311 and part of the second flat area 312 that extend from the folding area 313.

In various embodiments, the plate 320 may include a first plate 320 attached to the first flat area 311 by the first area 331 and a second plate 320 attached to the second flat area 312 by the second area 332. When viewed from above the rear surface of the panel layer 320, each of the first plate 320 and the second plate 320 may be formed to cover part of the folding area 313.

An electronic device 200 may include a housing structure that includes a first housing 210 and a second housing 220 and that is configured such that the first housing 210 and the second housing 220 are folded about a virtual folding axis F to face each other, and a display module 300 that is disposed in the first housing 210 and the second housing 220 and that includes a panel layer 310, an adhesive layer 330 that includes a first area 331, a second area 332, and a third area 333 formed between the first area 331 and the second area 332 and that is formed on a rear surface of the panel layer 310, and a plate 320 having at least a portion disposed on the first area 331 and the second area 332 and at least a portion extending to the third area 333. The display module 300 may include a first edge P1 extending in a direction perpendicular to the folding axis F, a second edge P2 facing the first edge P1, a third edge P3 extending in a direction of the folding axis F and adjacent to the first area 331, and a fourth edge P4 facing the third edge P3 and adjacent to the second area 332. The first area 331 may form a first boundary b1 with the third area 333, and the first boundary b1 connects the first edge P1 and the second edge P2 and is formed to be convex toward the third edge P3. The second area 332 may form a second boundary b2 with the third area 333, and the second boundary b2 connects the first edge P1 and the second edge P2 and is formed to be convex toward the fourth edge P4.

In various embodiments, the folding axis F may be formed between the first boundary b1 and the second boundary b2, and the first boundary b1 and the second boundary b2 may be symmetric to each other with respect to the folding axis F.

In various embodiments, the third area 333 may be formed such that the length of the third area 333 in the direction perpendicular to the folding axis F decreases from a central portion of the display module 300 toward the first edge P1 and the second edge P2 with respect to the direction of the folding axis F.

In various embodiments, each of the first area 331 and the second area 332 may include a double-sided adhesive layer that provides an adhesive force to the panel layer 310 and the plate 320, and the third area 333 may include a single-sided adhesive layer that provides an adhesive force to the rear surface of the panel layer 310.

In various embodiments, the display module 300 may include a first portion 301 and a second portion 302 formed to be a flat surface, and a third portion 303 formed between the first portion 301 and the second portion 302 and formed to be a flat surface or a curved surface. The third portion 303 may be formed between the first boundary b1 and the second boundary b2.

In various embodiments, the electronic device may include a flat state in which the third portion 303 is formed to be a flat surface and a folded state in which the third portion 303 is formed to be a curved surface. In the flat state, the plate 320 may be formed to be a flat surface that faces substantially the same direction as the adhesive layer 330, and in the folded state, at least part of the plate 320 may extend in the direction of a tangent surface of the third portion 303.

Figure 19:
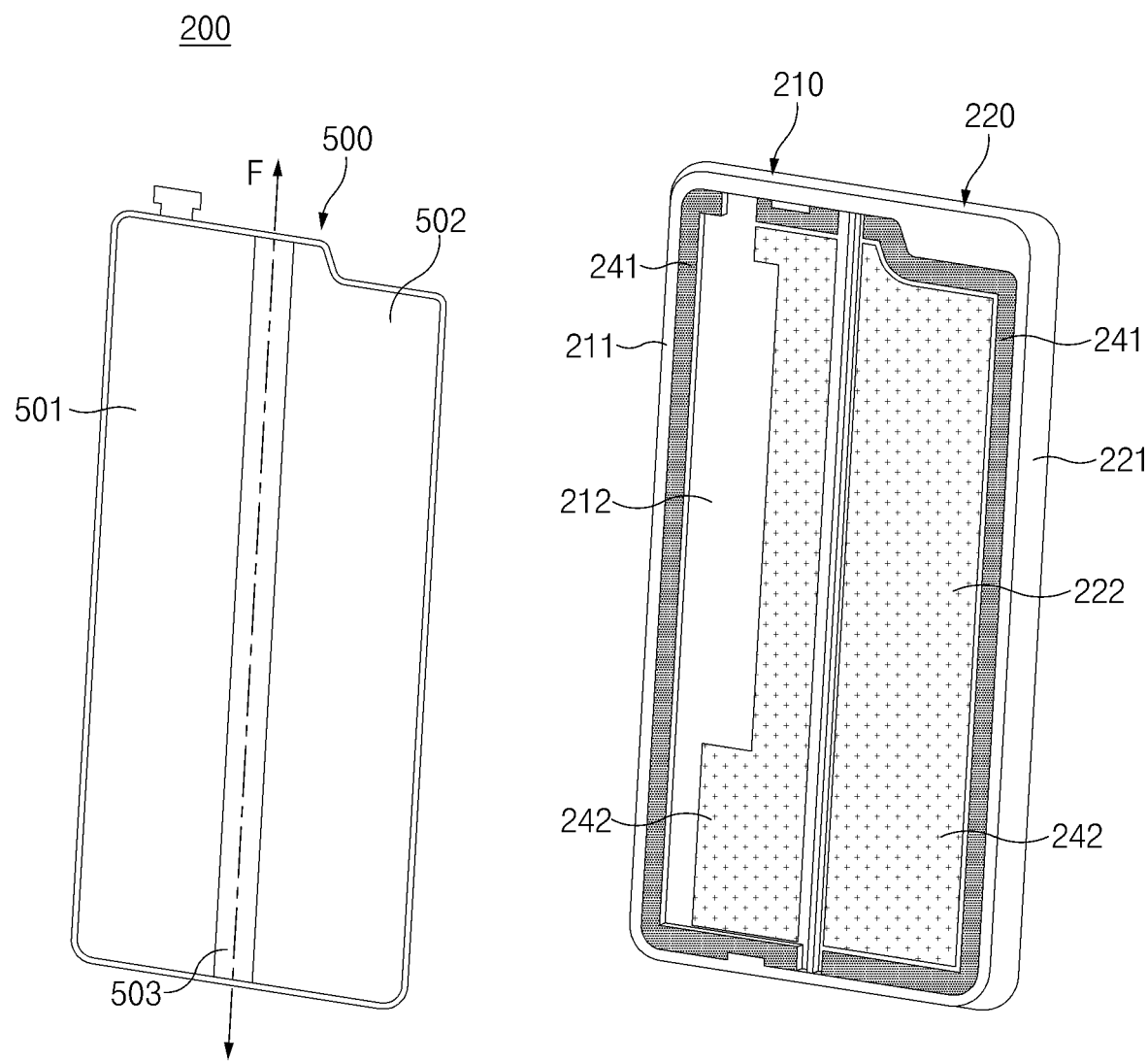
FIG. 19 is an exploded perspective view of an electronic device according to an embodiment of the disclosure.

FIG. 19 is an exploded perspective view of an electronic device according to an embodiment of the disclosure.

Referring to FIG. 19, the electronic device 200 may include a display module 500, a first housing 210, a second housing 220, an adhesive member 241, and a shock-absorbing member 242.

In an embodiment, the display module 500 may be disposed on a first plate structure 212 of the first housing 210 and a second plate structure 222 of the second housing 220. The display module 500 may be surrounded by a first frame structure 211 of the first housing 210 and a second frame structure 221 of the second housing 220. The display module 500 may be bonded to the first plate structure 212 of the first housing 210 and the second plate structure 222 of the second housing 220 by the adhesive member 241.

In an embodiment, the first housing 210 may include the first plate structure 212 facing toward a rear surface of the display module 500 and the first frame structure 211 formed on part of the periphery of the first plate structure 212. In an embodiment, the adhesive member 241 and the shock-absorbing member 242 may be disposed on the first plate structure 212. The first plate structure 212 may be coupled with a partial area of the display module 500. For example, at least part of a first portion 501 of the display module 500 may be bonded to the first plate structure 212 by the adhesive member 241. In an embodiment, the first plate structure 212, together with the second plate structure 222, may form an area on which the display module 500 is seated. In an embodiment, the first frame structure 211 may be formed to surround a partial area of the display module 500. The first frame structure 211 may be formed in a shape that is open toward the second plate structure 222. For example, the first frame structure 211 may be formed on the left edge, the upper edge, and the lower edge of the first plate structure 212. In an embodiment, the first frame structure 211, together with the second frame structure 221, may surround the periphery of the display module 500.

In an embodiment, the second housing 220 may include the second plate structure 222 facing toward the rear surface of the display module 500 and the second frame structure 221 formed on part of the periphery of the second plate structure 222. In an embodiment, the adhesive member 241 and the shock-absorbing member 242 may be disposed on the second plate structure 222. The second plate structure 222 may be coupled with a partial area of the display module 500. For example, at least part of a second portion 502 of the display module 500 may be bonded to the second plate structure 222 by the adhesive member 241. In an embodiment, the second plate structure 222, together with the first plate structure 212, may form the area on which the display module 500 is seated. In an embodiment, the second frame structure 221 may be formed to surround a partial area of the display module 500. The second frame structure 221 may be formed in a shape that is open toward the first plate structure 212. For example, the second frame structure 221 may be formed on the right edge, the upper edge, and the lower edge of the second plate structure 222. In an embodiment, the second frame structure 221, together with the first frame structure 211, may surround the periphery of the display module 500.

In an embodiment, the adhesive member 241 may be disposed on the first plate structure 212 and the second plate structure 222. At least part of the adhesive member 241 may be disposed along the extension directions of the first frame structure 211 and the second frame structure 221. The adhesive member 241 may be disposed such that at least part thereof surrounds the shock-absorbing member 242. In an embodiment, the adhesive member 241 may bond the periphery of the first portion 501 of the display module 500 to the first plate structure 212. The adhesive member 241 may bond the periphery of the second portion 502 of the display module 500 to the second plate structure 222.

In an embodiment, the shock-absorbing member 242 may include a cushion. The shock-absorbing member 242 may be configured to prevent a front surface of the display module 500 from being dented by a step on the rear surface of the display module 500 and/or warpage of the display module 500.

Figure 20:
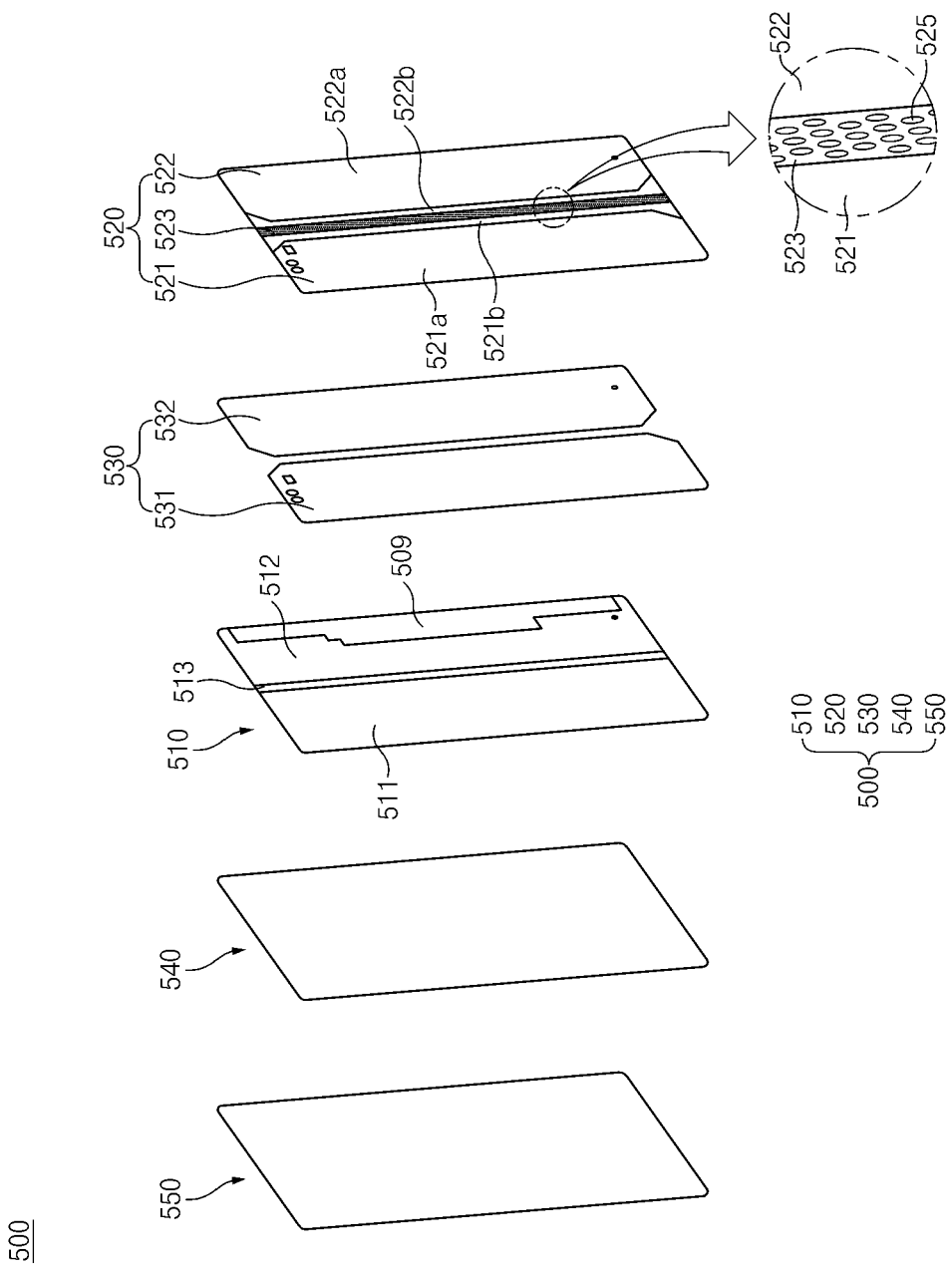
FIG. 20 is an exploded perspective view of a display module of the electronic device according to an embodiment of the disclosure.

FIG. 20 is an exploded perspective view of the display module of the electronic device according to an embodiment of the disclosure.

Referring to FIG. 20, in an embodiment, the display module 500 may include a plurality of layers. For example, the plurality of layers may include a panel layer 510, a support plate 520, an adhesive layer 530, an enhanced cover glass layer 540, and a cover layer 550. In an embodiment, the display module 500 may be configured to be folded or unfolded depending on a state of the electronic device 200.

In an embodiment, the cover layer 550 may form one surface of the display module 500. The cover layer 550 may be formed to protect the other layers included in the display module 500 from external shock.

In an embodiment, the enhanced cover glass layer 540 may be disposed between the cover layer 550 and the panel layer 510. The enhanced cover glass layer 540 may have a smaller thickness than the cover layer 550. The enhanced cover glass layer 540 may contain a glass material. The enhanced cover glass layer 540 may be more resistant to surface scratches than a layer formed of a polyimide (PI) material. In various embodiments, the enhanced cover glass layer 540 may have a greater thickness than the cover layer 550.

In an embodiment, the panel layer 510 may include a pixel array including a plurality of light emitting elements, an encapsulation layer that encapsulates the light emitting elements, a touch sensor layer including a touch electrode, and a wiring layer including transistors electrically connected with the light emitting elements.

In an embodiment, the panel layer 510 may be disposed between the enhanced cover glass layer 540 and the support plate 520. The panel layer 510 may be configured to emit light through the enhanced cover glass layer 540 and the cover layer 550 that are transparent. For example, a driver IC for driving the display module 500 may be disposed on a rear surface of the panel layer 510. For example, among the plurality of layers included in the panel layer 510, some layers (e.g., the wiring layer) may include an extension 509 that extends to the rear surface of the panel layer 510. The driver IC may be disposed on the extension 509.

In an embodiment, the panel layer 510 may include a first flat area 511, a second flat area 512, and a folding area 513 formed between the first flat area 511 and the second flat area 512. The first flat area 511 may be included in the first portion 501 of the display module 500. The first flat area 511 may be an area that is formed to be a flat surface in a flat state and a folded state. The second flat area 512 may be included in the second portion 502 of the display module 500. The second flat area 512 may be an area that is formed to be a flat surface in the flat state and the folded state. The folding area 513 may be included in a third portion 503 of the display module 500. The folding area 513 may be a bendable area that is formed to be a flat surface in the flat state and is formed to be a curved surface in the folded state.

In an embodiment, the adhesive layer 530 may be disposed between the panel layer 510 and the support plate 520 to attach the support plate 520 to the rear surface of the panel layer 510. In an embodiment, the adhesive layer 530 may include a first adhesive layer 531 and a second adhesive layer 532.

In an embodiment, the first adhesive layer 531 may be included in the first portion 501 of the display module 500. The first adhesive layer 531 may correspond to part of the first portion 501 of the display module 500. The first adhesive layer 531 may form a first attachment area 521*a* of a first support area 521. The first adhesive layer 531 may bond the first attachment area 521*a* of the first support area 521 to the rear surface of the panel layer 510. The first adhesive layer 531 may bond part of the first flat area 511 of the panel layer 510 and the first attachment area 521*a* of the first support area 521. The first adhesive layer 531 may be formed in a position spaced apart from the second adhesive layer 532 at a predetermined interval.

In an embodiment, the second adhesive layer 532 may be included in the second portion 502 of the display module 500. The second adhesive layer 532 may correspond to part of the second portion 502 of the display module 500. The second adhesive layer 532 may form a second attachment area 522*a* of a second support area 522. The second adhesive layer 532 may bond the second attachment area 522*a* of the second support area 522 to the rear surface of the panel layer 510. The second adhesive layer 532 may bond part of the second flat area 512 of the panel layer 510 and the second attachment area 522*a* of the second support area 522. The second adhesive layer 532 may be formed in a position spaced apart from the first adhesive layer 531 at the predetermined interval.

In an embodiment, the first adhesive layer 531 and/or the second adhesive layer 532 may be formed in an area other than the extension 509 on which the driver IC of the display module 500 is disposed.

In an embodiment, the support plate 520 may include the first support area 521, the second support area 522, and a slit area 523. The support plate 520 may be disposed on the rear surface of the panel layer 510 to ensure flat surface quality of the panel layer 510. For example, the support plate 520 may be configured to support the rear surface of the panel layer 510 such that in the flat state, the panel layer 510 is maintained to be a flat surface. In an embodiment, at least a partial area of the support plate 520 may be attached to the rear surface of the panel layer 510.

In an embodiment, at least part of the first support area 521 may be attached to the first flat area 511 of the panel layer 510 by the first adhesive layer 531, and another part of the first support area 521 may extend toward the folding area 513 of the panel layer 510. For example, the first support area 521 may include the first attachment area 521*a* attached to the first flat area 511 by the first adhesive layer 531 and a first extension area 521*b* extending from the first attachment area 521*a* toward the folding area 513.

In an embodiment, at least part of the second support area 522 may be attached to the second flat area 512 of the panel layer 510 by the second adhesive layer 532, and another part of the second support area 522 may extend toward the folding area 513 of the panel layer 510. For example, the second support area 522 may include the second attachment area 522a attached to the second flat area 512 by the second adhesive layer 532 and a second extension area 522b extending from the second attachment area 522a toward the folding area 513.

In an embodiment, the slit area 523 may include a plurality of slits 525. For example, the plurality of slits 525 may be openings formed through the support plate 520 and may be formed in a shape extending in the direction of a folding axis F. In an embodiment, the slit area 523 may be formed between the first support area 521 and the second support area 522. The slit area 523 may be included in the third portion 503 of the display module 500. For example, the slit area 523 may be formed between the first extension area 521b and the second extension area 522b. At least part of the slit area 523 may be disposed on the folding area 513 of the panel layer 510. For example, when viewed from above the support plate 520, the slit area 523 may be formed to be wider than the folding area 513 so as to cover the entire folding area 513 of the panel layer 510. In an embodiment, the slit area 523 may be formed to be a curved surface or a flat surface when the display module 500 is folded or unfolded. The slits 525 included in the slit area 523 may be deformed.

Figure 21:
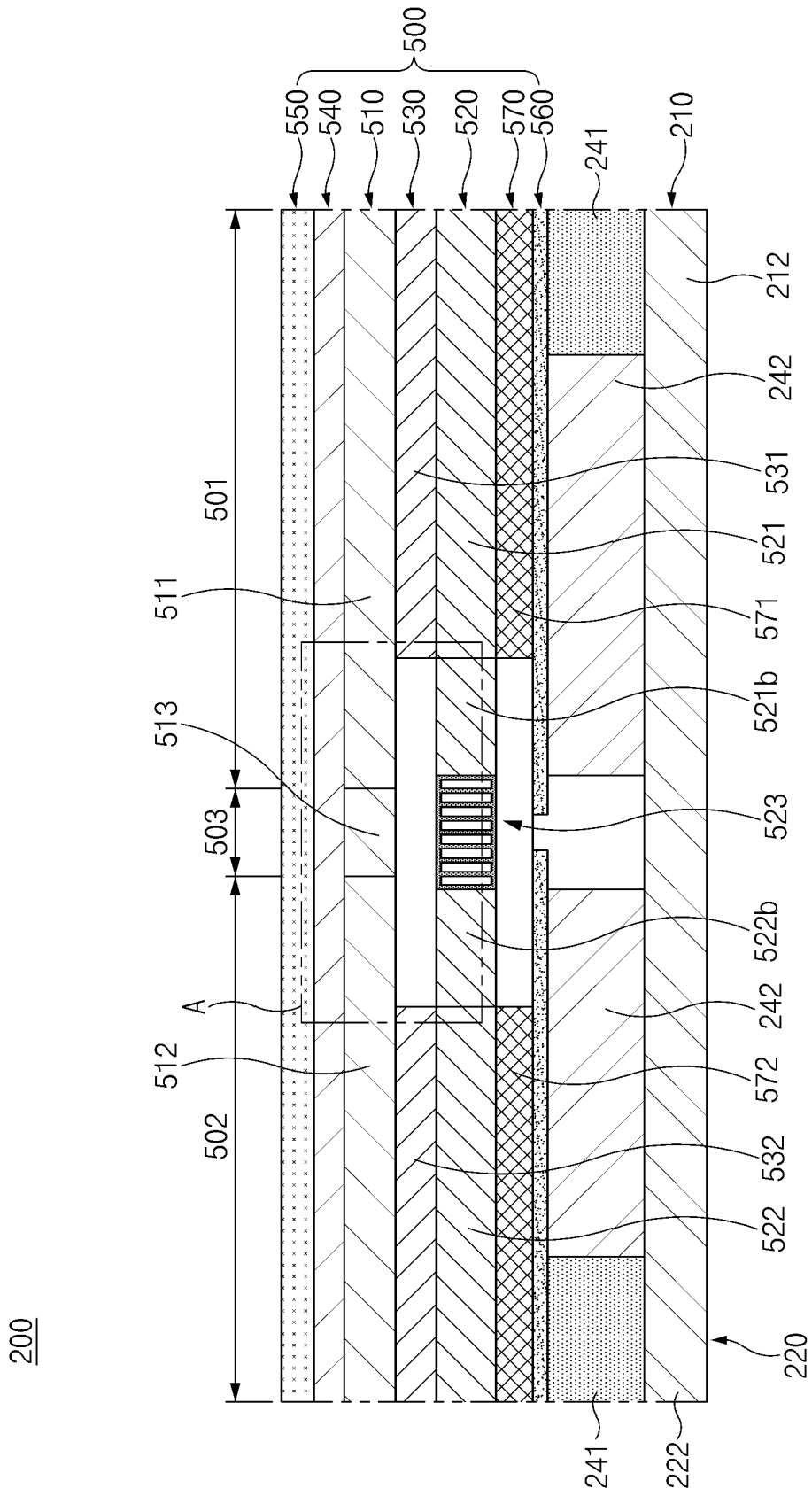
FIG. 21 is a sectional view of the electronic device according to an embodiment of the disclosure.

FIG. 21 is a sectional view of the electronic device according to an embodiment of the disclosure.

Referring to FIG. 21, the display module 500 may be coupled to the first housing 210 and the second housing 220 of the electronic device 200. The display module 500 may be disposed on the first plate structure 212 of the first housing 210 and the second plate structure 222 of the second housing 220. For example, the adhesive member 241 bonded to the periphery of the display module 500 and the shock-absorbing member 242 that absorbs shock applied to the display module 500 may be disposed on the first plate structure 212 and the second plate structure 222.

In an embodiment, when viewed from the front toward the rear of the electronic device 200, the display module 500 may include the cover layer 550, the enhanced cover glass layer 540, the panel layer 510, the adhesive layer 530, the support plate 520, and a metal layer 560.

In an embodiment, the first adhesive layer 531 may have a smaller area than the first flat area 511 of the panel layer 510. The first adhesive layer 531 may have a smaller width than the first flat area 511 of the panel layer 510. For example, when the rear surface of the panel layer 510 is viewed from above, the first adhesive layer 531 may not be formed on part of the first flat area 511 of the panel layer 510 that is adjacent to the folding area 513.

In an embodiment, the second adhesive layer 532 may have a smaller area than the second flat area 512 of the panel layer 510. The second adhesive layer 532 may have a smaller width than the second flat area 512 of the panel layer 510. For example, when the rear surface of the panel layer 510 is viewed from above, the second adhesive layer 532 may not be formed on part of the second flat area 512 of the panel layer 510 that is adjacent to the folding area 513.

In an embodiment, the first support area 521 of the support plate 520 may include the first attachment area 521a attached to the first flat area 511 of the panel layer 510 by the first adhesive layer 531 and the first extension area 521b extending from the first attachment area 521a to the slit area 523. The first extension area 521b may include an area not attached by the first adhesive layer 531. In an embodiment, when the third portion 503 of the display module 500 is deformed into a curved surface, the first extension area 521b may be deformed into a curved surface together with the slit area 523. In an embodiment, when the third portion 503 of the display module 500 is deformed into a curved surface, the first attachment area 521a may be formed to be a flat surface substantially parallel to the first flat area 511 of the panel layer 510.

In an embodiment, the second support area 522 of the support plate 520 may include the second attachment area 522a attached to the second flat area 512 of the panel layer 510 by the second adhesive layer 532 and the second extension area 522b extending from the second attachment area 522a to the slit area 523. The second extension area 522b may include an area not attached by the second adhesive layer 532. In an embodiment, when the third portion 503 of the display module 500 is deformed into a curved surface, the second extension area 522b may be deformed into a curved surface together with the slit area 523. In an embodiment, when the third portion 503 of the display module 500 is deformed into a curved surface, the second attachment area 522a may be formed to be a flat surface substantially parallel to the second flat area 512 of the panel layer 510.

In another embodiment, the slit area 523 may be further expanded to the first extension area 521b and the second extension area 522b illustrated. For example, the slit area 523 may be formed in an area other than areas (e.g., the first attachment area 521a and the second attachment area 522a) that are attached by the first adhesive layer 531 and the second adhesive layer 532.

In an embodiment, the display module 500 may further include the metal layer 560 disposed on a rear surface of the support plate 520. The metal layer 560 may be formed in a thin film form. To support deformation of the slit area 523, the metal layer 560 may be disposed on an area other than the slit area 523 of the support plate 520, or may be disposed to cover part of the slit area 523. For example, the metal layer 560 may be disposed on rear surfaces of the first support area 521 and the second support area 522. For example, the metal layer 560 disposed on the first support area 521 and the metal layer 560 disposed on the second support area 522 may be spaced apart from each other at an interval smaller than the width of the slit area 523.

In an embodiment, the display module 500 may further include an additional adhesive layer 570 for attaching the metal layer 560 to the support plate 520. The additional adhesive layer 570 may be disposed between the support plate 520 and the metal layer 560. The additional adhesive layer 570 may include a third adhesive layer 571 disposed between the first support area 521 and the metal layer 560 and a fourth adhesive layer 572 disposed between the second support area 522 and the metal layer 560.

In an embodiment, the third adhesive layer 571 may have a smaller area than the first flat area 511 of the panel layer 510. The third adhesive layer 571 may have a smaller width than the first flat area 511 of the panel layer 510. For example, when the rear surface of the support plate 520 is viewed from above, the third adhesive layer 571 may not be formed on part of the support plate 520 that is adjacent to the slit area 523. For example, the third adhesive layer 571 may be formed on an area corresponding to the first attachment area 521a of the support plate 520.

In an embodiment, the fourth adhesive layer 572 may have a smaller area than the second flat area 512 of the panel layer 510. The fourth adhesive layer 572 may have a smaller width than the second flat area 512 of the panel layer 510. For example, when the rear surface of the support plate 520 is viewed from above, the fourth adhesive layer 572 may not be formed on part of the support plate 520 that is adjacent to the slit area 523. For example, the fourth adhesive layer 572 may be formed on an area corresponding to the second attachment area 522a of the support plate 520.

FIG. 22, FIGS. 23A and 23B, and FIGS. 26A and 26B are views illustrating the adhesive layers 530 of the display module 500 applied to the foldable electronic device 200. The adhesive layers 530 that will be described below with reference to the drawings may be substantially identically applied to the additional adhesive layer 570 illustrated in FIG. 21.

Figure 22:
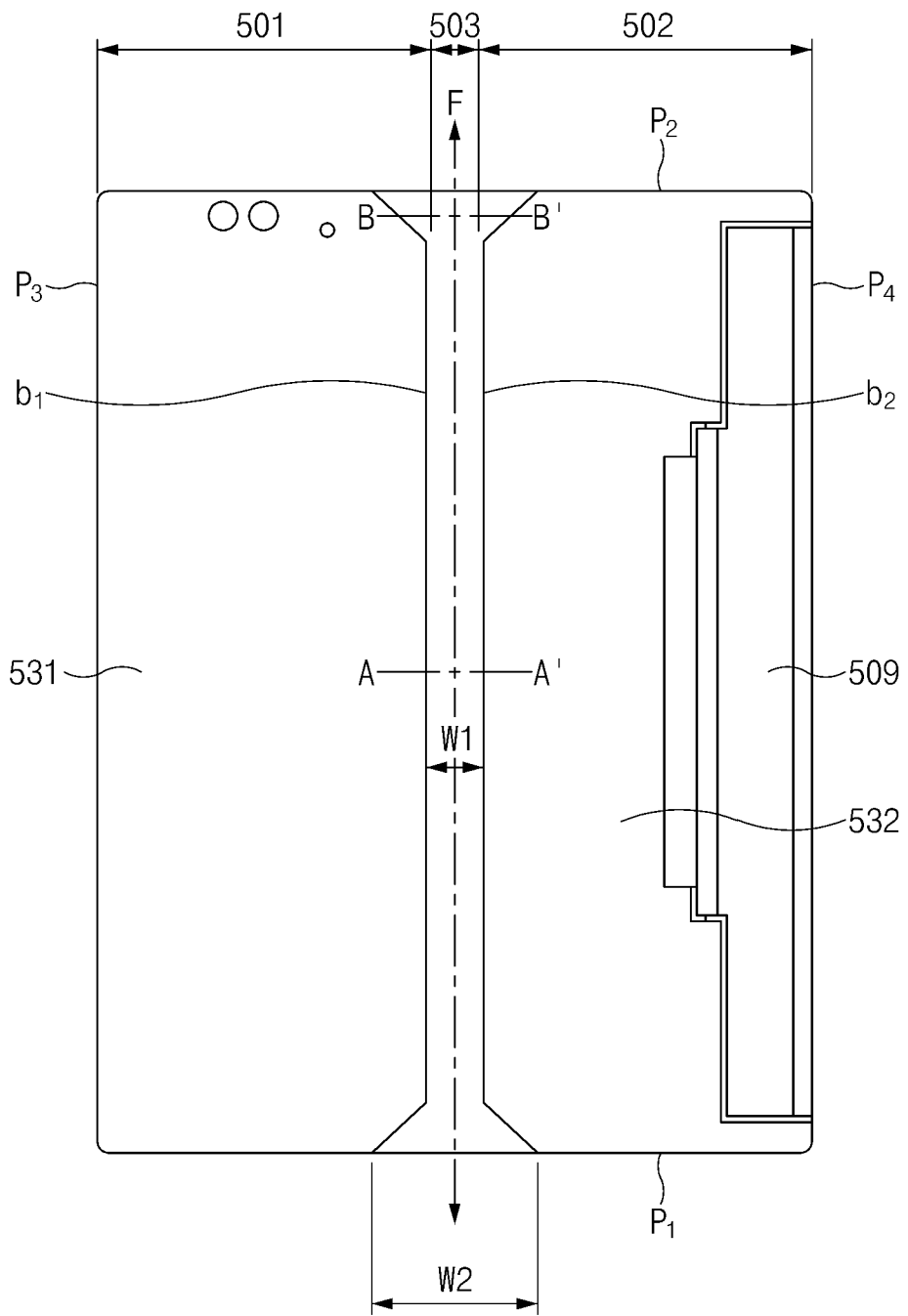
FIG. 22 is a view illustrating an adhesive layer of the display module of the electronic device according to an embodiment of the disclosure.
Figure 23B:
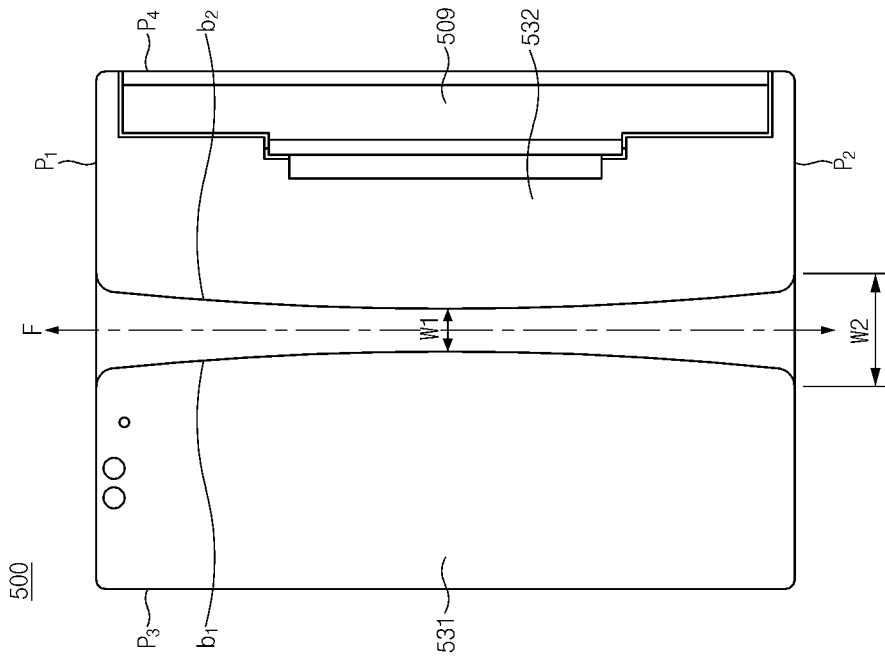
FIGS. 23A and 23B are views illustrating adhesive layers of the display module of the electronic device according to various embodiments of the disclosure.
Figure 23A:
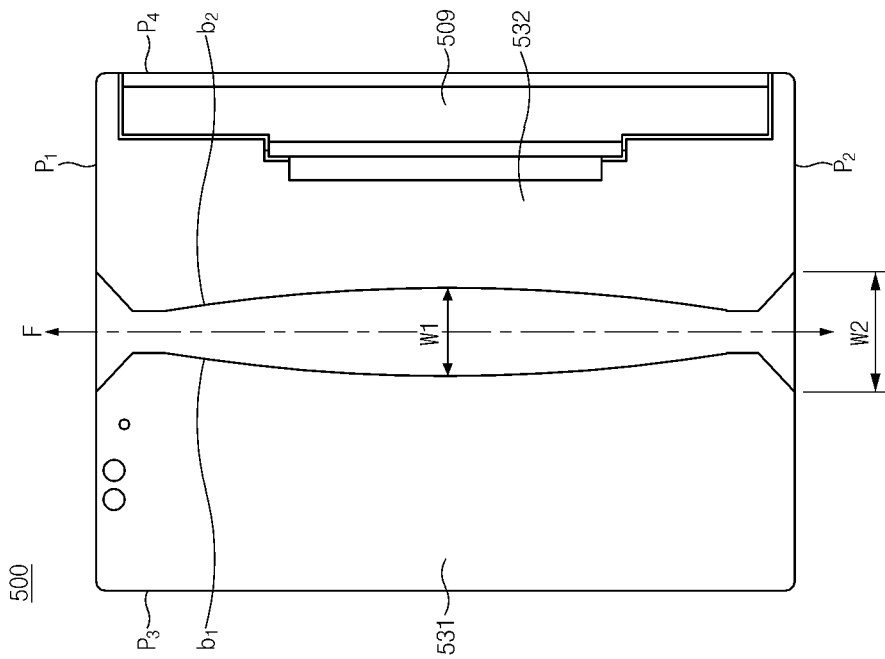

FIG. 22 is a view illustrating an adhesive layer of the display module of the electronic device according to an embodiment of the disclosure. FIGS. 23A and 23B are views illustrating adhesive layers of the display module of the electronic device according to various embodiments of the disclosure.

Referring to FIG. 22, in the display module 500, the first edge P1, the second edge P2, the third edge P3, and the fourth edge P4 may be defined. The third edge P3 and the fourth edge P4 may be edges parallel to the folding axis F. The first edge P1 and the second edge P2 may each connect the third edge P3 and the fourth edge P4. The first edge P1 and the second edge P2 may face each other in the direction of the folding axis F.

In an embodiment, the first adhesive layer 531 and the second adhesive layer 532 may be disposed to be spaced apart from each other at a predetermined interval.

In an embodiment, the first boundary b1 of the first adhesive layer 531 may extend from the first edge P1 to the second edge P2 of the display module 500. In an embodiment, the second boundary b2 of the second adhesive layer 532 may extend from the first edge P1 to the second edge P2 of the display module 500. For example, the first boundary b1 of the first adhesive layer 531 may be spaced apart from the second boundary b2 of the second adhesive layer 532 at a predetermined interval.

In an embodiment, the first adhesive layer 531 and the second adhesive layer 532 may be spaced apart from each other by the first width W1 at the central portion and may be spaced apart from each other by the second width W2 larger than the first width W1 at the portions adjacent to the first edge P1 and the second edge P2. For example, the first boundary b1 and the second boundary b2 may be spaced apart from each other by the first width W1 at the central portion and may be spaced apart from each other by the second width W2 larger than the first width W1 at the portions adjacent to the first edge P1 and the second edge P2.

In an embodiment, the enhanced cover glass layer 540 containing a glass material may be more brittle than a layer containing a PI material. When the display module 500 is unfolded or folded, a portion of the enhanced cover glass layer 540 that is included in the third portion 503 of the display module 500 may be deformed, and stress may be applied to the portion of the enhanced cover glass layer 540 by other stacked layers (e.g., the panel layer 510, the adhesive layer 530, and the support plate 520). In particular, peripheral portions (e.g., portions adjacent to the first edge P1 and the second edge P2) of the enhanced cover glass layer 540 may be easily damaged by external shock. To solve this problem, the first adhesive layer 531 and the second adhesive layer 532 may be spaced apart from each other at a wider interval at the peripheral portions. Accordingly, relatively small stress may be applied to the peripheral portions of the enhanced cover glass layer 540, and damage to the enhanced cover glass layer 540 may be prevented.

In the illustrated embodiment, the first boundary b1 of the first adhesive layer 531 and the boundary b2 of the second adhesive layer 532 may be formed to be substantially symmetric to each other with respect to the folding axis F. Accordingly, when the display module 500 is folded or unfolded, uniform stress may be applied to the first portion 501 and the second portion 502.

Referring to FIGS. 23A and 23B, the first adhesive layer 531 and the second adhesive layer 532 may be spaced apart from each other by the second width W2 at the peripheral portions and may be spaced apart from each other by the first width W1 smaller than the second width W2 at the central portion. The peripheral portions may be portions relatively vulnerable to shock when physical properties of the enhanced cover glass layer 540 are considered. The peripheral portions may be defined as portions adjacent to the first edge P1 and the second edge P2 of the display module 500. The central portion may be defined as the remaining portion other than the peripheral portions.

Referring to FIG. 22, the central portions of the first boundary b1 and the second boundary b2 may extend substantially parallel to each other, and the peripheral portions of the first boundary b1 and the second boundary b2 may extend in opposite directions away from each other. For example, the peripheral portions of the first boundary b1 and the second boundary b2 may obliquely extend toward the third edge P3 and the fourth edge P4.

Referring to FIGS. 23A and 23B, the peripheral portions of the first boundary b1 and the second boundary b2 may obliquely extend toward the third edge P3 and the fourth edge P4. The central portions of the first boundary b1 and the second boundary b2 may extend in a convex shape (e.g., FIG. 23A) or a concave shape (e.g., FIG. 23B) toward the third edge P3 and the fourth edge P4.

The descriptions of the first adhesive layer 531 and the second adhesive layer 532 illustrated in FIG. 22 and FIGS. 23A and 23B may be identically applied to the third adhesive layer 571 and the fourth adhesive layer 572 illustrated in FIG. 21. For example, the third adhesive layer 571 and the fourth adhesive layer 572 may be spaced apart from each other by the first width W1 at the central portion and may be spaced apart from each other by the second width W2 larger than the first width W1 at the portions adjacent to the first edge P1 and the second edge P2.

The shapes and structures of the adhesive layers illustrated in FIG. 22 and FIGS. 23A and 23B may be applied to at least one of the adhesive layer 530 for attaching the support plate 520 to the panel layer 510 and an additional adhesive layer (e.g., the additional adhesive layer 570 of FIG. 21) for attaching the metal layer 560 to the support plate 520.

Figure 24A:
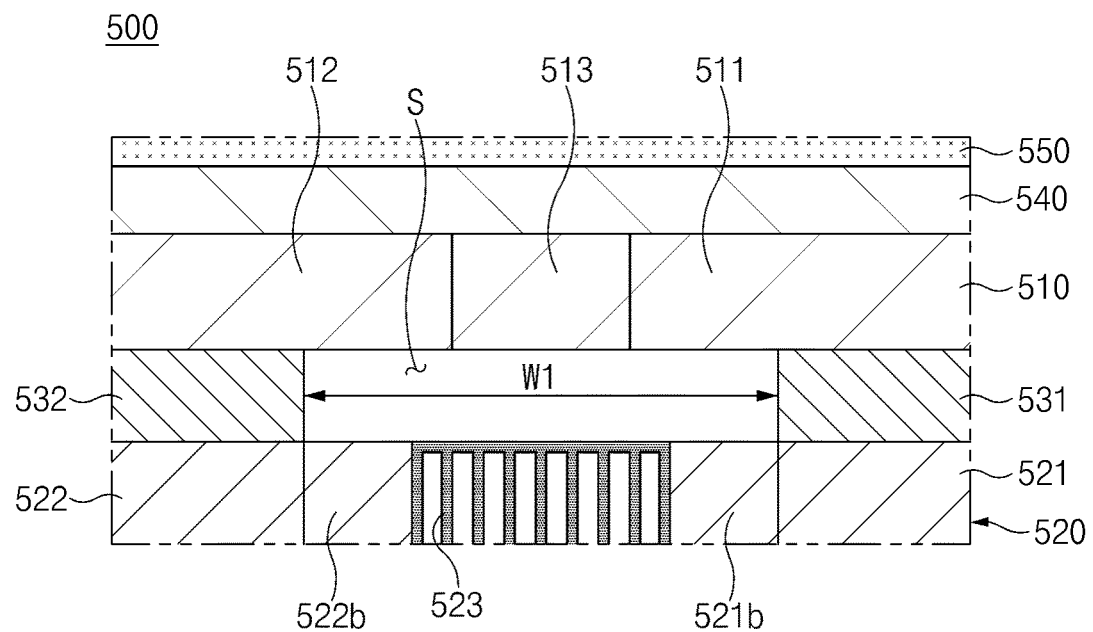
FIGS. 24A and 24B are sectional views of the display module of the electronic device according to various embodiments of the disclosure.
Figure 24B:
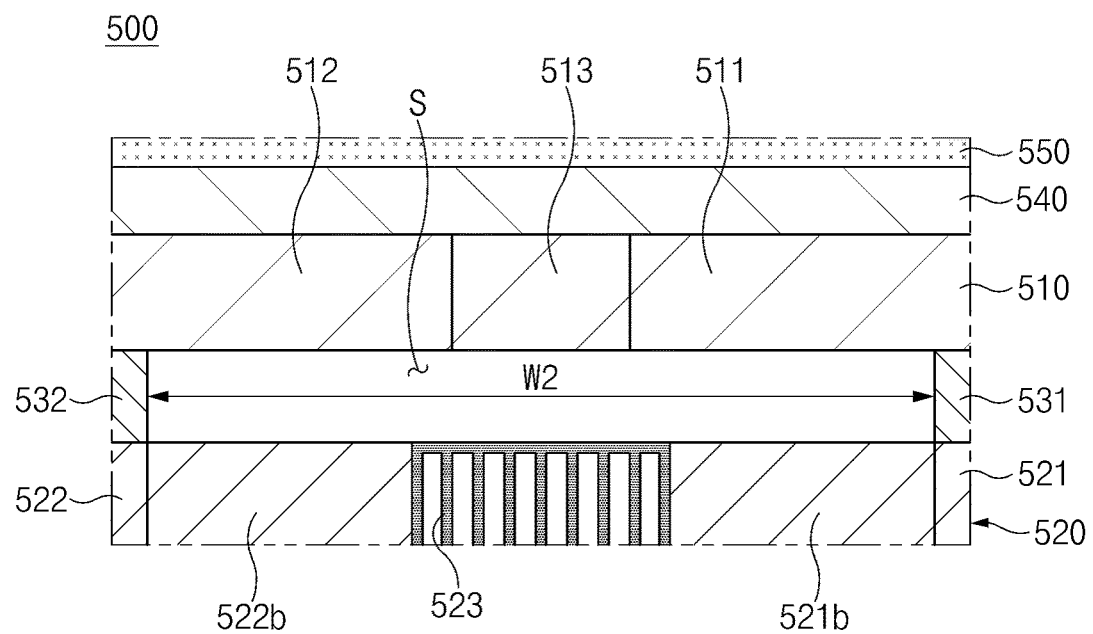

FIGS. 24A and 24B are sectional views of the display module of the electronic device according to various embodiments of the disclosure. FIG. 24A is a sectional view taken along line A-A' of FIG. 22, and FIG. 24B is a sectional view taken along line B-B' of FIG. 22.

Referring to FIGS. 24A and 24B, the display module 500 may include the cover layer 550, the enhanced cover glass layer 540, the panel layer 510, the first adhesive layer 531, the second adhesive layer 532, and the support plate 520.

In an embodiment, the support plate 520 and the panel layer 510 may be coupled by the first adhesive layer 531 and the second adhesive layer 532. For example, at least part of the first support area 521 may be attached to the rear surface of the panel layer 510 by the first adhesive layer 531. For example, at least part of the second support area 522 may be attached to the rear surface of the panel layer 510 by the second adhesive layer 532.

In an embodiment, a non-adhesive area S may be formed between the support plate 520 and the panel layer 510. For example, the non-adhesive area S may include an area not attached by the first adhesive layer 531 and the second adhesive layer 532. For example, the non-adhesive area S may include the folding area 513 of the panel layer 510, and the slit area 523 and the extension areas 521b and 522b of the support plate 520.

Referring to FIG. 24A, the non-adhesive area S in the central portion of the display module 500 may have the first width W1. Referring to FIG. 24B, the non-adhesive area S in the peripheral portion of the display module 500 may have the second width W2. The first width W1 may be smaller than the second width W2.

Figure 25A:
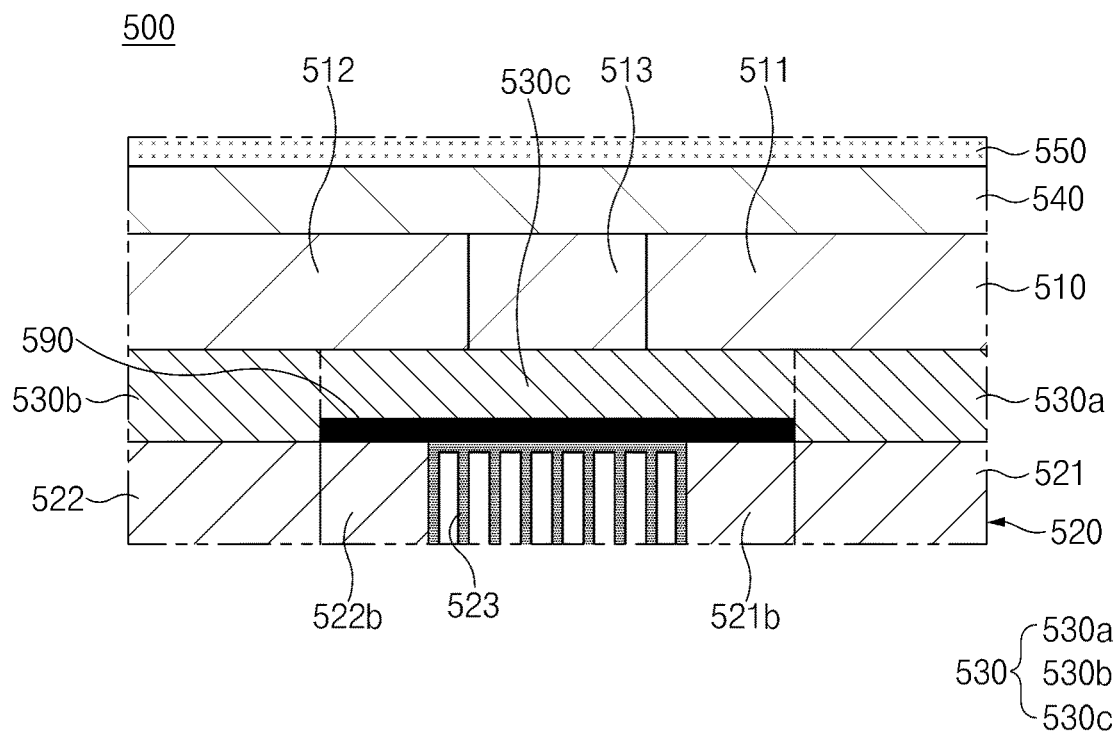
FIGS. 25A and 25B are sectional views of a display module of the electronic device according to various embodiments of the disclosure.
Figure 25B:
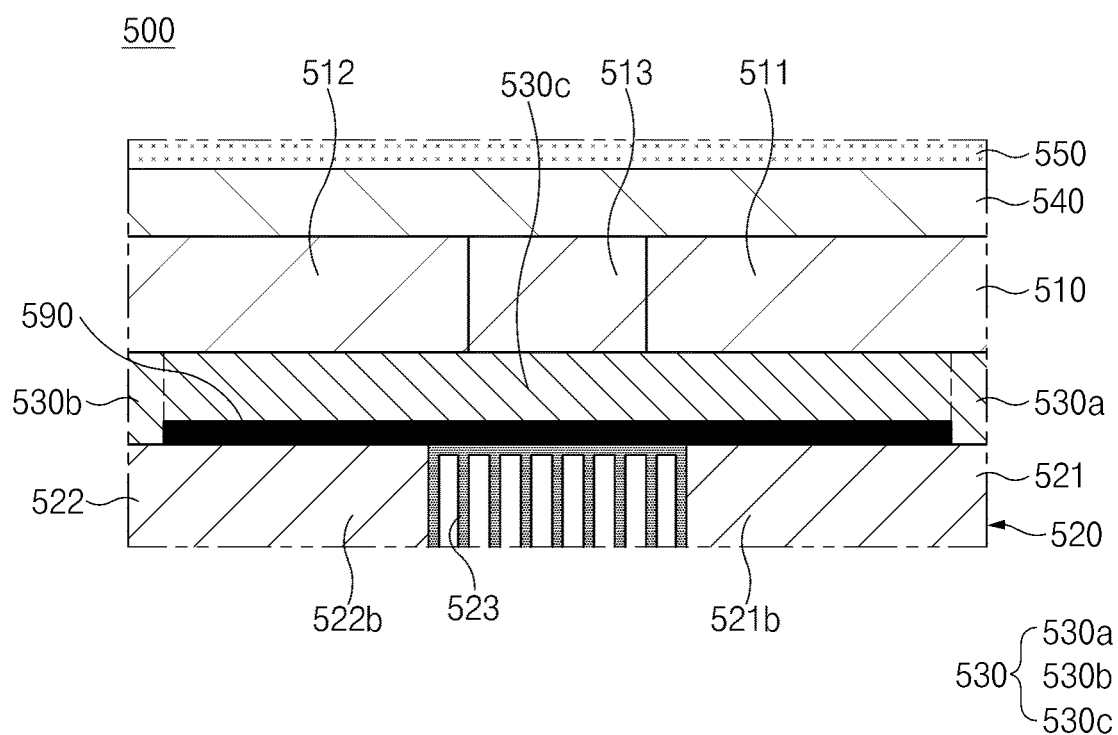

FIGS. 25A and 25B are sectional views of a display module of the electronic device according to various embodiments of the disclosure. FIG. 25A is a sectional view taken along line A-A' of FIG. 22, and FIG. 25B is a sectional view taken along line B-B' of FIG. 22. Repetitive descriptions identical to ones given with reference to FIGS. 24A and 24B will be omitted.

Referring to FIGS. 25A and 25B, the display module 500 may include the cover layer 550, the enhanced cover glass layer 540, the panel layer 510, the adhesive layer 530, a coating sheet 590, and the support plate 520.

In an embodiment, the adhesive layer 530 may include a first area 530a bonded to part of the first flat area 511 of the panel layer 510, a second area 530b bonded to part of the second flat area 512, and a third area 530c formed between the first area 530a and the second area 530b. In this case, the third area 530c may be a single-sided adhesive area that is attached to only the panel layer 510, but is not attached to the support plate 520. For example, the coating sheet 590 may be disposed between the third area 530c of the adhesive layer 530 and the support plate 520.

In an embodiment, the width of the third area 530c may be greater than the width of the folding area 510 of the panel layer 513. In an embodiment, the width of the third area 530c may be greater than the width of the slit area 523 of the support plate 520.

In an embodiment, the coating sheet 590 may be disposed on the third area 530c of the adhesive layer 530. The coating sheet 590 may contain a metallic material (e.g., AG, AF, or AL) and/or a polymer material. The coating sheet 590 may contain a UV curable material. The coating sheet 590 may include a single-sided sheet in a film form. Accordingly, the third area 530c of the adhesive layer 530 may be formed of a single-sided adhesive area that does not provide an adhesive force to the support plate 520, but provides an adhesive force to only the panel layer 510.

In various embodiments, the thicknesses of the areas 530a, 530b, and 530c of the adhesive layer 530 may be substantially uniformly formed because the third area 530c of the adhesive layer 530 includes the coating sheet 590 having a thin film form.

In an embodiment, a single-sided adhesive area may be formed between the support plate 520 and the panel layer 510. For example, the single-sided adhesive area may include an area that is attached to the panel layer 510 by the adhesive layer 530, but is not attached to the support plate 520. For example, the single-sided adhesive area may include the folding area 513 of the panel layer 510, the slit area 523 and the extension areas 521b and 522b of the support plate 520, the third area 530c of the adhesive layer 530, and the coating sheet 590.

Referring to FIGS. 25A and 25B, the width of the single-sided adhesive area in the central portion (e.g., FIG. 25A) of the display module 500 may be smaller than the width of the single-sided adhesive area in the peripheral portion (FIG. 25B) of the display module 500.

Unlike the display module 500 illustrated in FIGS. 24A and 24B, the display module 500 illustrated in FIGS. 25A and 25B may have a non-adhesive area S formed of a single-sided adhesive area including the adhesive layer 530 and the coating sheet 590 and may prevent the folding area 513 of the panel layer 510 from sagging toward the slit area 523 of the support plate 520 when the display module 500 is in a flat state.

Figure 26A:
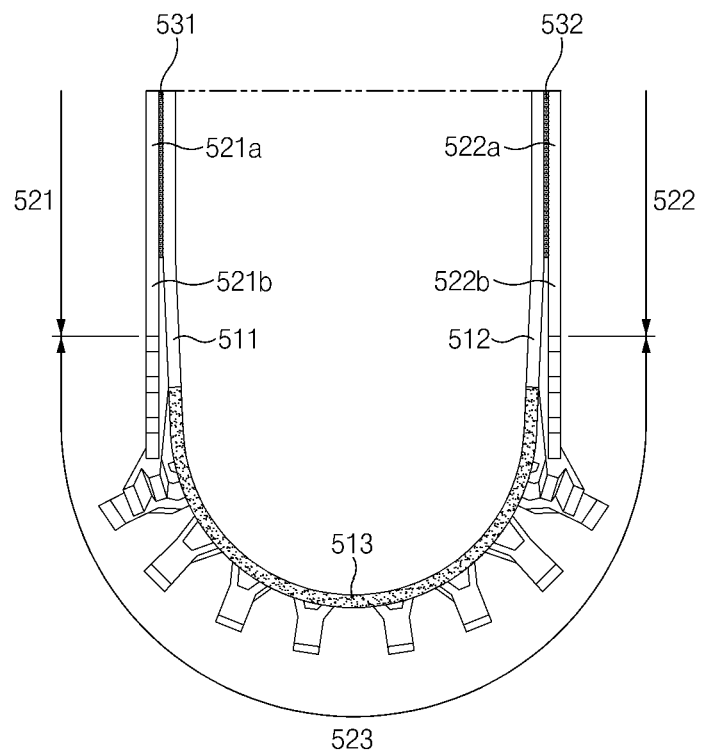
FIGS. 26A and 26B are views illustrating a folded state of the display module of the electronic device according to various embodiments of the disclosure.
Figure 26B:
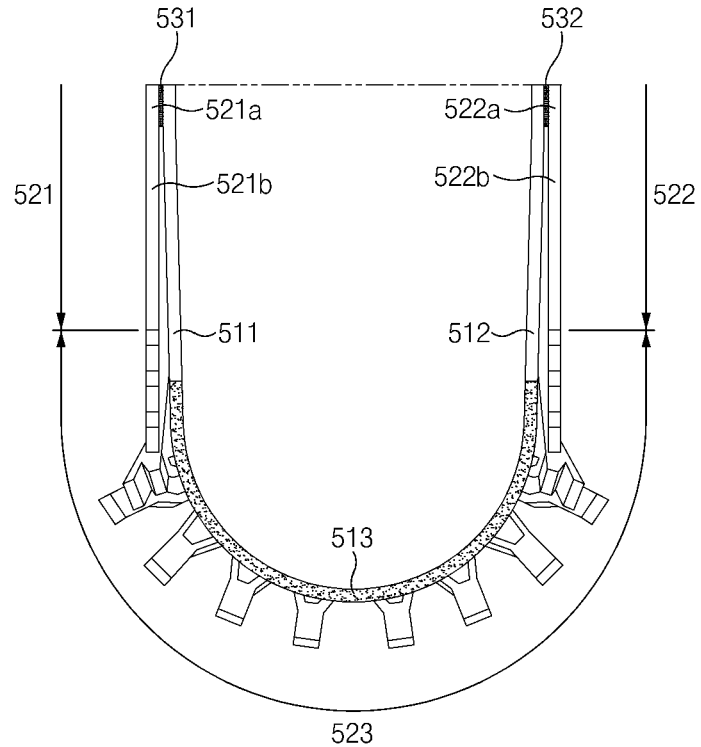

FIGS. 26A and 26B are views illustrating a folded state of the display module of the electronic device according to various embodiments of the disclosure. FIG. 26A is a sectional view taken along line A-A' of FIG. 22. FIG. 26B is a sectional view taken along line B-B' of FIG. 22.

Referring to FIGS. 26A and 26B, the support plate 520 may include the first support area 521, the second support area 522, and the slit area 523. Part of the first support area 521 may be attached to the first flat area 511 of the panel layer 510, part of the second support area 522 may be attached to the second flat area 512 of the panel layer 510, and the slit area 523 may surround a rear surface of the folding area 513 of the panel layer 510. The slit area 523 may be connected with the first extension area 521b of the first support area 521 and the second extension area 522b of the second support area 522.

In an embodiment, the first support area 521 may include the first attachment area 521a attached to the first flat area 511 and the first extension area 521b not attached to the panel layer 510. In the folded state, the first extension area 521b may be separated from the folding area 513 of the panel layer 510. In the folded state, the first extension area 521b may not be attached to the first flat area 511. In the flat state illustrated in FIG. 21, the first extension area 521b may face substantially the same direction as the first flat area 511 of the panel layer 510. In an embodiment, in the folded state, the first extension area 521b, together with the slit area 523, may be formed to be a curved surface.

In an embodiment, the second support area 522 may include the second attachment area 522a attached to the second flat area 512 and the second extension area 522b not attached to the panel layer 510. In the folded state, the second extension area 522b may be separated from the folding area 513 of the panel layer 510. In the folded state, the second extension area 522b may not be attached to the second flat area 512. In the flat state illustrated in FIG. 21, the second extension area 522b may face substantially the same direction as the second flat area 512 of the panel layer 510. In an embodiment, in the folded state, the second extension area 522b, together with the slit area 523, may be formed to be a curved surface.

FIG. 26A is a sectional view of a central portion (e.g., A-A' of FIG. 22) of the display module 500. Referring to FIG. 26A, in the folded state, the first adhesive layer 531 and the second adhesive layer 532 may be spaced apart from each other by a first length measured along the surface of the panel layer 510. The first length may be substantially the same as or greater than the first width W1 in FIG. 22.

FIG. 26B is a sectional view of a peripheral portion (e.g., B-B' of FIG. 22) of the display module 500. Referring to FIG. 26B, in the folded state, the first adhesive layer 531 and the second adhesive layer 532 may be spaced apart from each other by a second length measured along the surface of the panel layer 510. The second length may be substantially the same as or greater than the second width W2 in FIG. 22. In various embodiments, the second length may be smaller than the first length.

In various embodiments, the display module 500 may be formed such that the width (e.g., the first length L1) of a non-adhesive area in the central portion (e.g., FIG. 26A) is smaller than the width (e.g., the second length L2) of the non-adhesive area in the peripheral portion (FIG. 26B).

The descriptions of the first adhesive layer 531 and the second adhesive layer 532 illustrated in FIGS. 26A and 26B may be identically applied to the third adhesive layer 571 and the fourth adhesive layer 572 illustrated in FIG. 21. For example, in the folded state, the third adhesive layer 571 and the fourth adhesive layer 572 may be spaced apart from each other by the first length measured along the surface of the panel layer 510. In the flat state, the third adhesive layer 571 and the fourth adhesive layer 572 may be spaced apart from each other by the second length measured along the surface of the panel layer 510. The second length may be smaller than the first length.

The shape and structure of the adhesive layer illustrated in FIGS. 26A and 26B may be applied to at least one of the adhesive layer 530 for attaching the support plate 520 to the panel layer 510 and an additional adhesive layer (e.g., the additional adhesive layer 570 of FIG. 21) for attaching the metal layer 560 to the support plate 520.

In various embodiments, when the display module 500 is folded or unfolded, stress between the enhanced cover glass layer 540 and other stacked layers (e.g., the panel layer 510 and the adhesive layer 530) in the peripheral portion may be released because the non-adhesive area in the peripheral portion (e.g., FIG. 26B) is formed to be larger than the non-adhesive area in the central portion (e.g., FIG. 26A). Accordingly, damage to the peripheral portion of the enhanced cover glass layer 540 may be prevented.

In various embodiments, the widths L1 and L2 of the non-adhesive area in the central portion (FIG. 26A) and the peripheral portion (FIG. 26B) may be associated with the radius of curvature of the display module 500. Specifically, the difference between the widths L1 and L2 may vary depending on the stiffness of the layers included in the display module 500.

A display module 300 or 400 may include a display panel 310, 410, or 510 including a first edge P1 and a second edge P2 facing the first edge P1, a support plate 320, 420, or 520 disposed on a rear surface of the display panel 310, 410, or 510, and an adhesive layer 330, 430, or 530 disposed between the display panel 310, 410, or 510 and the support plate 320, 420, or 520. The adhesive layer 330, 430, or 530 may include a first area 331, 431, or 531 and a second area 332, 432, or 532 that provide a first adhesive force and a third area 333 or 433 that provides a second adhesive force different from the first adhesive force and that is disposed between the first area and the second area, the third area 333 or 433 extending from the first edge P1 to the second edge P2. The third area 333 or 433 may have a first width W1 in a central area between the first edge and the second edge and may have a second width W2 in areas adjacent to the first edge and the second edge, the second width W2 being different from the first width W1.

In various embodiments, the first adhesive force may be greater than the second adhesive force.

In various embodiments, the display module may further include a cover layer that is disposed on the display panel 310, 410, or 510 and that contains a PI material, and the first width W1 may be greater than the second width W2.

In various embodiments, the third area 333 or 433 may have a decreasing width from the central area toward the first edge P1 and the second edge P2.

In various embodiments, the display module may further include an enhanced cover glass layer 540 that is disposed on the display panel 510 and that contains a glass material, and the first width W1 may be smaller than the second width W2.

In various embodiments, the support plate 520 may include a first support area 521 coupled to the display panel 510 by the first area, a second support area 522 coupled to the display panel 510 by the second area, and a slit area 523 formed between the first support area 521 and the second support area 522, and the slit area 523 may include a plurality of slits 525 extending in a direction from the first edge P1 to the second edge P2.

In various embodiments, the first area 331, 431, or 531 and the second area 332, 432, or 532 may be formed of a double-sided adhesive area that provides an adhesive force to the display panel 310, 410, or 510 and the support plate 320, 420, or 520, and the third area 333 or 433 may be formed of a single-sided adhesive area that provides an adhesive force to the display panel.

In various embodiments, the single-sided adhesive area may include a coating sheet disposed between the third area 333 or 433 and the support plate 320, 420, or 520.

In various embodiments, the coating sheet may include a first coating sheet containing a UV curable material or a second coating sheet containing a metallic material.

In various embodiments, in a section of the display module 300 or 400, the thickness of the coating sheet and the third area may be substantially the same as the thickness of each of the first area and the second area.

In various embodiments, the adhesive layer 330, 430, or 530 may contain an adhesive material, and the adhesive material may have a higher density in the third area 333 or 433 than in the first area 331, 431, or 531 and the second area 332, 432, or 532.

An electronic device 200 may include a housing structure including a first housing 210 and a second housing 220, and a display module 500 disposed in the first housing and the second housing, in which the first housing 210 and the second housing 220 may be unfolded or folded about a folding axis F. The display module 500 may include a cover layer that forms a surface of the electronic device, a panel layer 510 including a pixel array, an enhanced cover glass layer 540 disposed between the cover layer and the panel layer 510, a support plate 520 disposed on a rear surface of the panel layer 510, and a first adhesive layer 531 and a second adhesive layer 532 that bond the panel layer 510 and the support plate 520. The panel layer 510 may include a first flat area, a second flat area, and a folding area 513 formed to be a curved surface or a flat surface when the first housing 210 and the second housing 220 are unfolded or folded. The support plate 520 may include a first support area 521 attached to at least part of the first flat area 511 by the first adhesive layer 531, a second support area 522 attached to at least part of the second flat area 512 by the second adhesive layer 532, and a slit area 523 that is formed between the first support area 521 and the second support area 522 and that includes a plurality of slits. When viewed from above the rear surface of the panel layer 510, the first adhesive layer 531 and the second adhesive layer 532 may be spaced apart from each other by a first width W1 at a central portion in a direction of the folding axis F and may be spaced apart from each other by a second width W2 at edges in the direction of the folding axis F, the second width W2 being greater than the first width W1.

In various embodiments, when viewed from above the display module 500, the slit area 523 may be located between the first adhesive layer 531 and the second adhesive layer 532 and may have a greater width than the folding area 513.

In various embodiments, each of the first adhesive layer 531 and the second adhesive layer 532 may further include a single-sided adhesive area that provides an adhesive force to the panel layer 510.

An electronic device 200 may include a housing structure that includes a first housing 210 and a second housing 220 and that is configured such that the first housing 210 and the second housing 220 are folded about a virtual folding axis F to face each other, and a display module 300 or 400 disposed in the first housing 210 and the second housing 220, the display module 300 or 400 including a panel layer 310 or 410, an adhesive layer 330 or 430, and a plate 320 or 420, in which the adhesive layer 330 or 430 may include a first area 331 or 431, a second area 332 or 432, and a third area 333 or 433 formed between the first area 331 or 431 and the second area 332 or 432 and may be formed on a rear surface of the panel layer, and the plate 320 or 420 may include at least a portion disposed on the first area 331 or 431 and the second area 332 or 432 and at least a portion extending to the third area 333 or 433. The display module 300 or 400 may include a first edge P1 extending in a direction perpendicular to the folding axis F, a second edge P2 facing the first edge P1, a third edge P3 extending in a direction of the folding axis F and adjacent to the first area 331 or 431, and a fourth edge P4 facing the third edge P3 and adjacent to the second area 332 or 432. The first area 331 or 431 may form a first boundary b1 with the third area 333 or 433, and the second area 332 or 432 may form a second boundary 2 with the third area 333 or 433. The first boundary b1 and the second boundary b2 may extend from the first edge to the second edge such that the first boundary and the second boundary have a first interval at a central portion between the first edge and the second edge and have a second interval at a portion adjacent to the first edge and/or the second edge, the second interval being different from the first interval.

In various embodiments, the first interval may be greater than the second interval.

In various embodiments, the display module 500 may further include an enhanced cover glass layer 540 containing a glass material, and the first interval may be smaller than the second interval.

In various embodiments, the first boundary b1 may connect the first edge P1 and the second edge P2 and may be formed to be convex toward the third edge P3, and the second boundary b2 may connect the first edge P1 and the second edge P2 and may be formed to be convex toward the fourth edge P4.

In various embodiments, the folding axis F may be formed between the first boundary b1 and the second boundary b2, and the first boundary and the second boundary may be substantially symmetric to each other with respect to the folding axis.

In various embodiments, the plate 520 may include a first support area 521 coupled to the panel layer 510 by the first area 531, a second support area 522 coupled to the panel layer 510 by the second area 522, and a slit area 523 formed between the first support area and the second support area, and the slit area 523 may include a plurality of slits 525 extending in the direction of the folding axis F.

According to the embodiments of the disclosure, in a folded state, the folding area of the display module may have a uniform curvature. Accordingly, damage to the display module or surface deformation of the display module may be prevented, and the lifetime of the display module may be extended.

In addition, the disclosure may provide various effects that are directly or indirectly recognized.

Various embodiments of the disclosure and terms used herein are not intended to limit the technologies described in the disclosure to specific embodiments, and it should be understood that the embodiments and the terms include modification, equivalent, and/or alternative on the corresponding embodiments described herein. With regard to description of drawings, similar components may be marked by similar reference numerals. The terms of a singular form may include plural forms unless otherwise specified. In the disclosure disclosed herein, the expressions "A or B," "at least one of A and/or B," "A, B, or C," or "at least one of A, B, and/or C," and the like used herein may include any and all combinations of one or more of the associated listed items. Expressions such as "first," or "second," and the like, may express their components regardless of their priority or importance and may be used to distinguish one component from another component but is not limited to these components. When an (e.g., first) component is referred to as being "(operatively or communicatively) coupled with/to" or "connected to" another (e.g., second) component, it may be directly coupled with/to or connected to the other component or an intervening component (e.g., a third component) may be present.

According to the situation, the expression "adapted to or configured to" used herein may be interchangeably used as, for example, the expression "suitable for," "having the capacity to," "changed to," "made to," "capable of" or "designed to" in hardware or software. The expression "a device configured to" may mean that the device is "capable of" operating together with another device or other parts. For example, a "processor configured to (or set to) perform A, B, and C" may mean a dedicated processor (e.g., an embedded processor) for performing corresponding operations or a generic-purpose processor (e.g., a central processing unit (CPU) or an application processor (AP)) which performs corresponding operations by executing one or more software programs which are stored in a memory device (e.g., a memory).

The term "module" used herein may include a unit, which is implemented with hardware, software, or firmware, and may be interchangeably used with the terms "logic," "logical block," "part," "circuit," or the like. The "module" may be a minimum unit of an integrated part or a part thereof or may be a minimum unit for performing one or more functions or a part thereof. The "module" may be implemented mechanically or electronically and may include, for example, an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in a computer-readable storage media (e.g., a memory) in the form of a program module. The instruction, when executed by a processor (e.g., a processor), may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The one or more instructions may contain a code made by a compiler or a code executable by an interpreter.

Each component (e.g., a module or a program module) according to various embodiments may be composed of single entity or a plurality of entities, a part of the above-described sub-components may be omitted, or other sub-components may be further included. Alternatively or additionally, after being integrated in one entity, some components (e.g., a module or a program module) may identically or similarly perform the function executed by each corresponding component before integration. According to various embodiments, operations executed by modules, program modules, or other components may be executed by a successive method, a parallel method, a repeated method, or a heuristic method, or at least one part of operations may be executed in different sequences or omitted. Alternatively, other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. A display module comprising:
  a display panel including a first edge and a second edge facing the first edge;
  a support plate disposed on a rear surface of the display panel; and
  an adhesive layer disposed between the display panel and the support plate,
  wherein the adhesive layer includes:
    a first area and a second area configured to provide a first adhesive force; and
    a third area configured to provide a second adhesive force different from the first adhesive force and disposed between the first area and the second area, the third area extending from the first edge to the second edge, and
  wherein the third area has a first width in a central area between the first edge and the second edge and a second width in areas adjacent to the first edge and the second edge, the second width being different from the first width.

2. The display module of claim 1, wherein the first adhesive force is greater than the second adhesive force.

3. The display module of claim 1, further comprising:
  a cover layer disposed on the display panel, the cover layer comprising a polyimide (PI) material,
  wherein the first width is greater than the second width.

4. The display module of claim 3, wherein the third area has a decreasing width from the central area toward the first edge and the second edge.

5. The display module of claim 1, further comprising:
  an enhanced cover glass layer disposed on the display panel, the enhanced cover glass layer comprising a glass material,
  wherein the first width is smaller than the second width.

6. The display module of claim 1,
  wherein the support plate includes:
    a first support area coupled to the display panel by the first area;
    a second support area coupled to the display panel by the second area; and
    a slit area formed between the first support area and the second support area, and
  wherein the slit area includes a plurality of slits extending in a direction from the first edge to the second edge.

7. The display module of claim 1,
  wherein the first area and the second area are formed of a double-sided adhesive area configured to provide an adhesive force to the display panel and the support plate, and
  wherein the third area is formed of a single-sided adhesive area configured to provide an adhesive force to the display panel.

8. The display module of claim 7, wherein the single-sided adhesive area includes a coating sheet disposed between the third area and the support plate.

9. The display module of claim 8, wherein the coating sheet includes a first coating sheet comprising an ultraviolet (UV) curable material or a second coating sheet comprising a metallic material.

10. The display module of claim 8, wherein in a section of the display module, a thickness of the coating sheet and the third area is substantially the same as a thickness of each of the first area and the second area.

11. The display module of claim 1,
  wherein the adhesive layer comprises an adhesive material, and
  wherein the adhesive material has a higher density in the third area than in the first area and the second area.

12. An electronic device comprising:
  a housing structure including a first housing and a second housing, wherein the first housing and the second housing are configured to be unfolded or folded about a folding axis; and
  a display module disposed in the first housing and the second housing,
  wherein the display module includes:
    a cover layer configured to form a surface of the electronic device,
    a panel layer including a pixel array,
    an enhanced cover glass layer disposed between the cover layer and the panel layer,
    a support plate disposed on a rear surface of the panel layer, and
    a first adhesive layer and a second adhesive layer configured to bond the panel layer and the support plate,
  wherein the panel layer includes a first flat area, a second flat area, and a folding area configured to be a curved surface or a flat surface when the first housing and the second housing are unfolded or folded,
  wherein the support plate includes:
    a first support area attached to at least part of the first flat area by the first adhesive layer,
    a second support area attached to at least part of the second flat area by the second adhesive layer, and
    a slit area formed between the first support area and the second support area, the slit area including a plurality of slits, and
  wherein when viewed from above the rear surface of the panel layer, the first adhesive layer and the second adhesive layer are spaced apart from each other by a first width at a central portion in a direction of the folding axis and are spaced apart from each other by a second width at edges in the direction of the folding axis, the second width being greater than the first width.

13. The electronic device of claim 12, wherein when viewed from above the display module, the slit area is located between the first adhesive layer and the second adhesive layer and has a greater width than the folding area.

14. The electronic device of claim 12, wherein each of the first adhesive layer and the second adhesive layer further includes a single-sided adhesive area configured to provide an adhesive force to the panel layer.

15. An electronic device comprising:
a housing structure including a first housing and a second housing, wherein the housing structure is configured such that the first housing and the second housing are configured to be folded about a folding axis to face each other; and
a display module disposed in the first housing and the second housing, the display module including: a panel layer, an adhesive layer, and a plate,
wherein the adhesive layer includes a first area, a second area, and a third area formed between the first area and the second area and is formed on a rear surface of the panel layer, and the plate includes at least a portion disposed on the first area and the second area and at least a portion extending to the third area,
wherein the display module includes a first edge extending in a direction perpendicular to the folding axis, a second edge facing the first edge, a third edge extending in a direction of the folding axis and adjacent to the first area, and a fourth edge facing the third edge and adjacent to the second area,
wherein the first area forms a first boundary with the third area,
wherein the second area forms a second boundary with the third area, and
wherein the first boundary and the second boundary extend from the first edge to the second edge such that the first boundary and the second boundary have a first interval at a central portion between the first edge and the second edge and have a second interval at a portion adjacent to the first edge or the second edge, the second interval being different from the first interval.

16. The electronic device of claim 15, wherein the first interval is greater than the second interval.

17. The electronic device of claim 15,
wherein the display module further includes an enhanced cover glass layer comprising a glass material, and
wherein the first interval is smaller than the second interval.

18. The electronic device of claim 15,
wherein the first boundary connects the first edge and the second edge and is configured to be convex toward the third edge, and
wherein the second boundary connects the first edge and the second edge and is configured to be convex toward the fourth edge.

19. The electronic device of claim 15,
wherein the folding axis is formed between the first boundary and the second boundary, and
wherein the first boundary and the second boundary are substantially symmetric to each other with respect to the folding axis.

20. The electronic device of claim 15,
wherein the plate includes a first support area coupled to the panel layer by the first area, a second support area coupled to the panel layer by the second area, and a slit area formed between the first support area and the second support area, and
wherein the slit area includes a plurality of slits extending in the direction of the folding axis.

* * * * *